United States Patent
Son et al.

(10) Patent No.: US 9,087,993 B2
(45) Date of Patent: Jul. 21, 2015

(54) CROSS-LINKABLE POLYMER, CROSS-LINKED MATERIAL OF THE CROSS-LINKABLE POLYMER, ORGANIC LIGHT EMITTING DEVICE COMPRISING THE CROSS-LINKED MATERIAL AND METHOD OF PREPARING THE ORGANIC LIGHT EMITTING DEVICE

(75) Inventors: Jhun-mo Son, Yongin-si (KR); Ho-suk Kang, Seoul (KR); Hye-yeon Yang, Seoul (KR); Won-jae Joo, Seongnam-si (KR); Ji-hoon Lee, Chungju-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 653 days.

(21) Appl. No.: 12/980,925

(22) Filed: Dec. 29, 2010

(65) Prior Publication Data
US 2011/0175069 A1    Jul. 21, 2011

(30) Foreign Application Priority Data

Jan. 20, 2010 (KR) ........................ 10-2010-0005252

(51) Int. Cl.
| | | |
|---|---|---|
| H01L 51/50 | (2006.01) | |
| H01L 51/40 | (2006.01) | |
| C08G 73/06 | (2006.01) | |
| H01L 51/00 | (2006.01) | |
| C08G 61/12 | (2006.01) | |
| C08G 73/02 | (2006.01) | |
| C09K 11/06 | (2006.01) | |
| H05B 33/14 | (2006.01) | |

(52) U.S. Cl.
CPC ............ *H01L 51/0043* (2013.01); *C08G 61/12* (2013.01); *C08G 61/122* (2013.01); *C08G 73/026* (2013.01); *C08G 73/0273* (2013.01); *C09K 11/06* (2013.01); *H05B 33/14* (2013.01); *C08G 2261/135* (2013.01); *C08G 2261/1414* (2013.01); *C08G 2261/1424* (2013.01); *C08G 2261/1475* (2013.01); *C08G 2261/314* (2013.01); *C08G 2261/3142* (2013.01); *C08G 2261/3162* (2013.01); *C08G 2261/3245* (2013.01); *C08G 2261/5222* (2013.01); *C08G 2261/76* (2013.01); *C09K 2211/1416* (2013.01); *C09K 2211/1433* (2013.01); *C09K 2211/1475* (2013.01); *H01L 51/0039* (2013.01); *H01L 51/5012* (2013.01)

(58) Field of Classification Search
None
See application file for complete search history.

(56) References Cited

U.S. PATENT DOCUMENTS 5,985,417 A    11/1999  Shi et al.

FOREIGN PATENT DOCUMENTS

| JP | 2009-227856 | 10/2009 |
|---|---|---|
| WO | WO 2005/009979 A1 | 2/2005 |
| WO | WO 2009/067419 A1 | 5/2009 |

*Primary Examiner* — J. L. Yang
(74) *Attorney, Agent, or Firm* — Cantor Colburn LLP

(57) ABSTRACT

A cross-linkable polymer including 1,1'-binaphthyl repeating units linked through 6,6'-arylene groups, a cross-linked material comprising the cross-linkable polymer, an organic light emitting device including the cross-linked material, and a method of preparing the organic light emitting device are each disclosed.

19 Claims, 6 Drawing Sheets

CROSS-LINKABLE POLYMER, CROSS-LINKED MATERIAL OF THE CROSS-LINKABLE POLYMER, ORGANIC LIGHT EMITTING DEVICE COMPRISING THE CROSS-LINKED MATERIAL AND METHOD OF PREPARING THE ORGANIC LIGHT EMITTING DEVICE

CROSS-REFERENCE TO RELATED APPLICATIONS

This application claims priority to Korean Patent Application No. 10-2010-0005252, filed on Jan. 20, 2010, and all the benefits accruing therefrom under 35 U.S.C. 119, the content of which in its entirety is herein incorporated by reference.

BACKGROUND

1. Field

The present disclosure relates to a polymer and an organic light emitting device including the polymer.

2. Description of the Related Art

Organic light emitting devices include a pair of electrodes and an organic layer interposed between the electrodes, wherein, when a current is supplied to the electrodes, electrons and holes injected through the electrodes are re-combined in the organic layer, thereby emitting light. Accordingly, organic light emitting devices are self-emission-type devices. Organic light emitting devices are lightweight, and can be easily manufactured using a relatively small number of components. In addition, organic light emitting devices provide high-quality images and have wide viewing angles. Furthermore, organic light emitting devices provide high color purity, accurately realize mobile images, have low power consumption, and are operated at low voltage. Due to these characteristics, organic light emitting devices are suitable for mobile electronic devices.

An organic light emitting display device includes an anode that is formed on a substrate, a hole transport layer (HTL), an emission layer (EML), and an electron transport layer (ETL) which are formed on the anode as organic layers, and a cathode that is formed thereon.

When a current is supplied to the anode and the cathode, holes injected through the anode move to the EML via the HTL, and electrons injected through the cathode move to the EML via the ETL. The holes and electrons recombine in the EML to generate excitons. The excitons are radioactively decaying to emit light having a wavelength corresponding to a band gap of the molecule.

Materials that are used in organic layers may be classified into vacuum depositable materials and solution coatable materials according to a method of preparing the organic layer. The solution coatable materials are miscible with a solvent to form a composition that may be coated on a substrate. The composition may be applied to the substrate, and the like using known methods such as inkjet printing, screen printing, and spin coating.

SUMMARY

In an embodiment, a cross-linkable polymer having a binaphthyls structure is provided.

In another embodiment, a cross-linked material composed of the cross-linkable polymer is provided.

In another embodiment, an organic light emitting device includes the cross-linked material composed of the cross-linkable polymer.

In another embodiment, a method of preparing the organic light emitting device is provided.

Additional features of the invention will be set forth in part in the description which follows and, in part, will be apparent from the description, or may be learned by practice of the presented embodiments.

According to an embodiment, a cross-linkable polymer includes Formula 1 below;

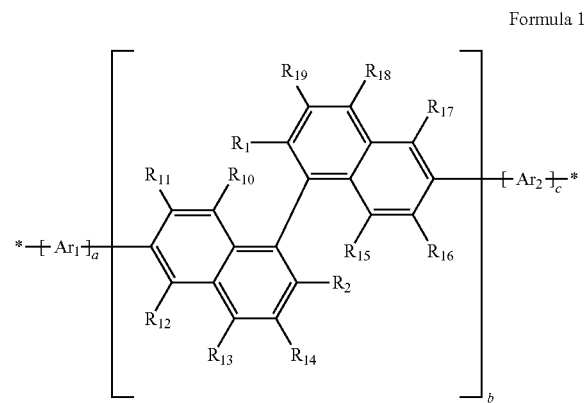

Formula 1 wherein $R_1$, $R_2$, and $R_{10}$ to $R_{19}$ are each independently selected from the group consisting of a cross-linkable group, a hydrogen atom, a halogen atom, a hydroxyl group, an amino group, a cyano group, a carboxylic acid group, a substituted or unsubstituted $C_1$-$C_{30}$ alkyl group, a substituted or unsubstituted $C_1$-$C_{30}$ alkoxy group, a substituted or unsubstituted $C_6$-$C_{30}$ aryl group, a substituted or unsubstituted $C_6$-$C_{30}$ aryloxy group, a substituted or unsubstituted $C_3$-$C_{30}$ heteroaryl group, —$N(Q_1)(Q_2)$, —$Si(Q_3)(Q_4)(Q_5)$, and any combination thereof, wherein at least one of $R_1$ and $R_2$ is a cross-linkable group;

$Ar_1$ is a bivalent group -$(L_1)_n$-, wherein $L_1$ is selected from the group consisting of a linking group —$N(Q_6)$—, a substituted or unsubstituted $C_6$-$C_{30}$ arylene group, a substituted or unsubstituted $C_3$-$C_{30}$ heteroarylene group, and any combination thereof, n is an integer of from 1 to 20, and the individual $L_1$ groups of -$(L_1)_n$- are the same or different;

$Q_1$ to $Q_6$ are each independently selected from the group consisting of a hydrogen atom, a halogen atom, a hydroxyl group, an amino group, a cyano group, carboxylic acid, a substituted or unsubstituted $C_1$-$C_{30}$ alkyl group, a substituted or unsubstituted $C_1$-$C_{30}$ alkoxy group, a substituted or unsubstituted $C_6$-$C_{30}$ aryl group, a substituted or unsubstituted $C_6$-$C_{30}$ aryloxy group, a substituted or unsubstituted $C_3$-$C_{30}$ heteroaryl group, and any combination thereof;

$Ar_2$ is selected from the group consisting of a substituted or unsubstituted $C_6$-$C_{30}$ arylene group, a substituted or unsubstituted $C_3$-$C_{30}$ heteroarylene group, and any combination thereof; and a, b, and c are each independently a real number wherein $0 \leq a \leq 0.99$, $0 < b \leq 0.99$, and $0 < c \leq 0.99$, and $a+b+c=1$.

According to another embodiment, a cross-linked material includes the cross-linkable polymer.

According to another embodiment, an organic light emitting device includes a substrate; a first electrode; a second electrode; a first layer interposed between the first electrode and the second electrode and which includes a cross-linked material including the cross-linkable polymer.

According to another embodiment, a method of preparing an organic light emitting device includes: forming a first electrode on a surface of a substrate;

forming a first layer including a cross-linked material including the cross-linkable polymer by providing a first layer-forming composition including the cross-linkable polymer on a surface of the first electrode, and heat-treating the cross-linkable polymer to cross-link the cross-linkable polymer; and forming a second electrode on a surface of the first layer.

BRIEF DESCRIPTION OF THE DRAWINGS

These and/or other features will become apparent and more readily appreciated from the following description of the embodiments, taken in conjunction with the accompanying drawings in which.

DETAILED DESCRIPTION

Figure 1:
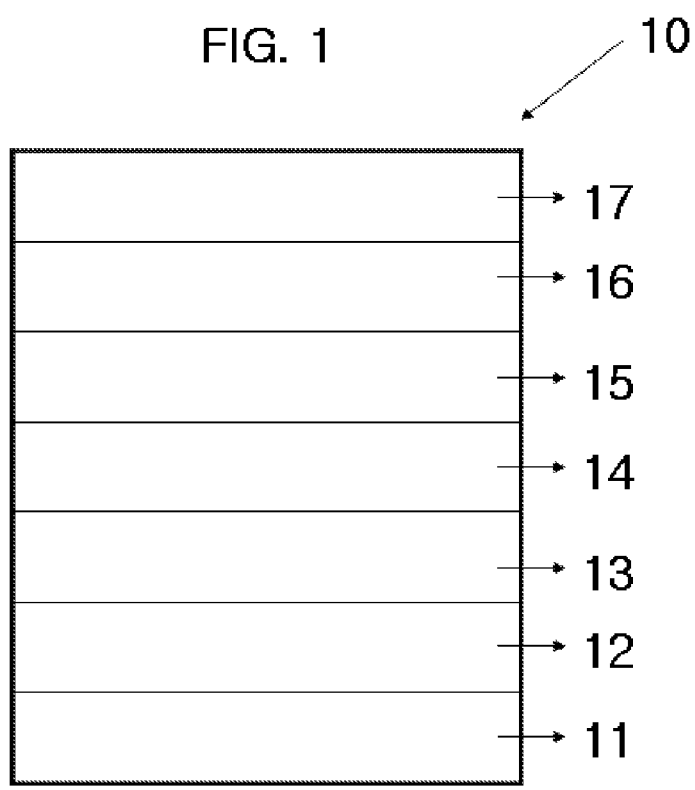
FIG. 1 is a schematic cross-sectional view of an organic light emitting device according to an embodiment.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description.

In the figures, like reference numerals refer to like elements, and the size or thickness of respective elements may be exaggerated for the clarity of description.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, regions, integers, steps, operations, elements, and/or components, but do not preclude the presence or addition of one or more other features, regions, integers, steps, operations, elements, components, and/or groups thereof. All ranges and endpoints reciting the same feature are independently combinable.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

When a definition is not otherwise provided, the term "substituted" refers to one substituted with a halogen, a C1 to C20 alkyl group, a C1 to C20 alkoxy group, a C6 to C30 aryl group, or a C6 to C30 aryloxy group.

As used herein, "Alkyl" refers to a straight or branched chain saturated aliphatic hydrocarbon having the specified number of carbon atoms. "Alkenyl" is a straight or branched chain hydrocarbon that comprises at least one carbon-carbon double bond. "Alkoxy" refers to an alkyl moiety that is linked via an oxygen (i.e., —O-alkyl). The term "alkylene" refers to a straight, branched or cyclic divalent aliphatic hydrocarbon group. The term "alkenylene" refers to a straight, branched or cyclic divalent aliphatic hydrocarbon group containing a double bond. The term "alkynyl" refers to a straight or branched chain hydrocarbon that has one or more unsaturated carbon-carbon bonds, at least one of which is a triple bond. As used herein "aryl," means a cyclic moiety in which all ring members are carbon and at least one ring is aromatic. More than one ring may be present, and any additional rings may be independently aromatic, saturated or partially unsaturated, and may be fused, pendant, spirocyclic or any combination thereof. An "arylalkylene" group is an aryl group linked via an alkylene moiety. The specified number of carbon atoms (e.g., C7 to C20) refers to the total number of carbon atoms present in both the aryl and the alkylene moieties. Representative arylalkyl groups include, for example, benzyl groups. As used herein, "arylalkyl" refers to an alkylene group in which one of the hydrogen atoms of the alkylene is replaced by an aryl group. As used herein, the term "arylene" refers to a divalent radical formed by the removal of two hydrogen atoms from one or more rings of an aromatic hydrocarbon, wherein the hydrogen atoms may be removed from the same or different rings (preferably different rings), each of which rings may be aromatic or non-aromatic. "Aryloxy" refers to an aryl moiety that is linked via an oxygen (i.e., —O-aryl). "Cycloalkylene" refers to a divalent radical formed by the removal of two hydrogen atoms from one or more rings of a cycloalkyl group (a non-aromatic hydrocarbon that comprises at least one ring). A "heteroalkyl" group is an alkyl group that comprises at least one heteroatom covalently bonded to one or more carbon atoms of the alkyl group. A "heteroaryl" group is a monovalent carbocyclic ring system that includes one or more aromatic rings, in which at least one ring member (e.g., one, two or three ring members) is a heteroatom. "Heteroarylene" refers to a divalent radical formed by the removal of two hydrogen atoms from one or more rings of a heteroaryl moiety, wherein the hydrogen atoms may be removed from the same or different rings (preferably the same ring), each of which rings may be aromatic or non-aromatic. As used herein, "combination" is inclusive of blends, mixtures, alloys, reaction products, and the like. A "heteroarylalkyl" group is a heteroaryl group linked via an alkylene moiety. "Cyclo" refers to a moiety having a ring structure, where multiple rings, if present, may be pendant, spiro or fused.

A cross-linkable polymer including 1,1'-binaphthyl repeating units linked through 6,6'-arylene groups is disclosed herein. According to an embodiment, a cross-linkable polymer has the structure of Formula 1, below.

Formula 1

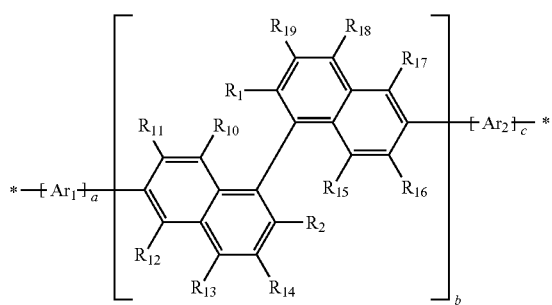

In Formula 1, $R_1$, $R_2$, and $R_{10}$ to $R_{19}$ are each independently selected from the group consisting of a cross-linkable group, a hydrogen atom, a halogen atom, a hydroxyl group, an amino group, a cyano group, a carboxylic acid group, a substituted or unsubstituted $C_1$-$C_{30}$ alkyl group, a substituted or unsubstituted $C_1$-$C_{30}$ alkoxy group, a substituted or unsubstituted $C_6$-$C_{30}$ aryl group, a substituted or unsubstituted $C_6$-$C_{30}$ aryloxy group, a substituted or unsubstituted $C_3$-$C_{30}$ heteroaryl group, $-N(Q_1)(Q_2)$, $-Si(Q_3)(Q_4)(Q_5)$, and any combination thereof. At least one of $R_1$ and $R_2$ is a cross-linkable group. For example, both of $R_1$ and $R_2$ may be cross-linkable groups.

$Q_1$ to $Q_5$ may be each independently selected from the group consisting of a hydrogen atom, a halogen atom, a hydroxyl group, an amino group, a cyano group, a carboxylic acid group, a substituted or unsubstituted $C_1$-$C_{30}$ alkyl group, a substituted or unsubstituted $C_1$-$C_{30}$ alkoxy group, a substituted or unsubstituted $C_6$-$C_{30}$ aryl group, a substituted or unsubstituted $C_6$-$C_{30}$ aryloxy group, and a substituted or unsubstituted $C_3$-$C_{30}$ heteroaryl group. For example, $Q_1$ to $Q_5$ may each be independently selected from the group consisting of a hydrogen atom, a halogen atom, a hydroxyl group, an amino group, a cyano group, a carboxylic acid group, a $C_1$-$C_{10}$ alkyl group, a $C_1$-$C_{10}$ alkoxy group, a $C_6$-$C_{14}$ aryl group, a $C_3$-$C_{14}$ heteroaryl group, and any combination thereof, but are not limited thereto.

For example, $R_{10}$ to $R_{19}$ may each be independently selected from the group consisting of a hydrogen atom, a halogen atom, a hydroxyl group, an amino group, a cyano group, a carboxylic acid group, a substituted or unsubstituted $C_1$-$C_{10}$ alkyl group, a substituted or unsubstituted $C_1$-$C_{10}$ alkoxy group, a substituted or unsubstituted $C_6$-$C_{14}$ aryl group, a substituted or unsubstituted $C_6$-$C_{14}$ aryloxy group, a substituted or unsubstituted $C_3$-$C_{14}$ heteroaryl group, and any combination thereof, but are not limited thereto.

$R_{10}$ to $R_{19}$ may be each independently selected from the group consisting of a hydrogen atom, a halogen atom, a hydroxyl group, an amino group, a cyano group, a carboxylic acid group, a methyl group, an ethyl group, a propyl group, a butyl group, a pentyl group, a methoxy group, an ethoxy group, a propoxy group, a butoxy group, a pentoxy group, and any combination thereof, but are not limited thereto.

The cross-linkable group may be selected from the group consisting of a $C_1$-$C_{30}$ alkyl group including at least one cross-linkable moiety, a $C_1$-$C_{30}$ alkoxy group including at least one cross-linkable moiety, a $C_6$-$C_{30}$ aryl group including at least one cross-linkable moiety, a $C_6$-$C_{30}$ aryloxy group including at least one cross-linkable moiety, a $C_3$-$C_{30}$ heteroaryl group including at least one cross-linkable moiety, and any combination thereof. At least one of the hydrogen atoms contained in the $C_1$-$C_{30}$ alkyl group including at least one cross-linkable moiety, the $C_1$-$C_{30}$ alkoxy group including at least one cross-linkable moiety, the $C_6$-$C_{30}$ aryl group including at least one cross-linkable moiety, the $C_6$-$C_{30}$ aryloxy group including at least one cross-linkable moiety, and the $C_3$-$C_{30}$ heteroaryl group including at least one cross-linkable moiety may be substituted with at least one substituent selected from the group consisting of a halogen atom, a hydroxyl group, an amino group, a cyano group, a carboxylic acid group, a $C_1$-$C_{10}$ alkyl group (e.g., methyl group, ethyl group, or a linear or branched alkyl group such as a propyl group, butyl group, pentyl group, hexyl group, heptyl group, octyl group, and the like), a $C_1$-$C_{10}$ alkoxy group (e.g., methoxy group, ethoxy group, propoxy group, butoxy group, pentoxy group, and the like), a $C_6$-$C_{14}$ aryl group (e.g., phenyl group, naphthyl group, anthracenyl group, fluorenyl group, and the like), a $C_3$-$C_{14}$ heteroaryl group (e.g., carbazolyl group, pyridinyl group, pyrrolyl group, pyrimidinyl group, and the like), and any combination thereof.

The cross-linkable moiety of the cross-linkable group may include any moiety that participates in cross-linking reactions through addition reactions, condensation reactions, or the like. For example, the cross-linkable moiety may be one selected from the group consisting of Formulae 2A, 2B, 2C, and 2D below, but is not limited thereto.

Formula 2A

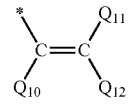

Formula 2B

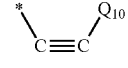

Formula 2C

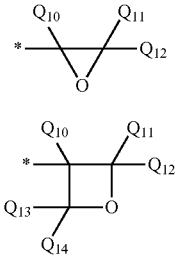

Formula 2D

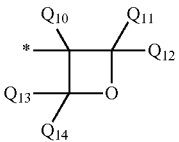

In Formulae 2A to 2D, $Q_{10}$ to $Q_{14}$ may be each independently selected from the group consisting of a hydrogen atom, a halogen atom, a hydroxyl group, an amino group, a cyano group, a carboxylic acid group, a substituted or unsubstituted $C_1$-$C_{30}$ alkyl group, a substituted or unsubstituted $C_1$-$C_{30}$ alkoxy group, a substituted or unsubstituted $C_6$-$C_{30}$ aryl group, a substituted or unsubstituted $C_6$-$C_{30}$ aryloxy group, a substituted or unsubstituted $C_3$-$C_{30}$ heteroaryl group. As used herein, the presence of an asterisk (*) at the terminus of a bond denotes the point of attachment of the group to another moiety. In Formulas 2A-2D the asterisk (*) represents the binding site of the group with the backbone of the cross-linkable group.

For example, $Q_{10}$ to $Q_{14}$ of Formulae 2A to 2D may each be independently selected from the group consisting of a hydrogen atom, a halogen atom, a hydroxyl group, an amino group, a cyano group, a carboxylic acid group, a $C_1$-$C_{10}$ alkyl group (e.g., methyl group, ethyl group, or a linear or branched alkyl such as a propyl group, butyl group, pentyl group, hexyl group, heptyl group, and the like), a $C_1$-$C_{10}$ alkoxy group (e.g., methoxy group, ethoxy group, propoxy group, butoxy group, pentoxy group, and the like), a $C_6$-$C_{14}$ aryl group (e.g., phenyl group, naphthyl group, anthracenyl group, fluorenyl group, and the like), and a $C_3$-$C_{14}$ heteroaryl group (e.g., carbazolyl group, pyridinyl group, pyrrolyl group, pyrimidinyl group, and the like), but are not limited thereto.

For example, the cross-linkable moiety may be Formula 2A-1 (in which $Q_{10}$ to $Q_{12}$ of Formula 2A are hydrogen), or Formula 2B-1 (in which $Q_{10}$ of Formula 2B is hydrogen).

Formula 2A-1

Formula 2B-1

In Formulae 2A-1 and 2B-1, the asterisk (*) is the binding site of the group with a backbone of the cross-linkable group.

The cross-linkable group may be one selected from the group consisting of Formulae 3A to 3H below.

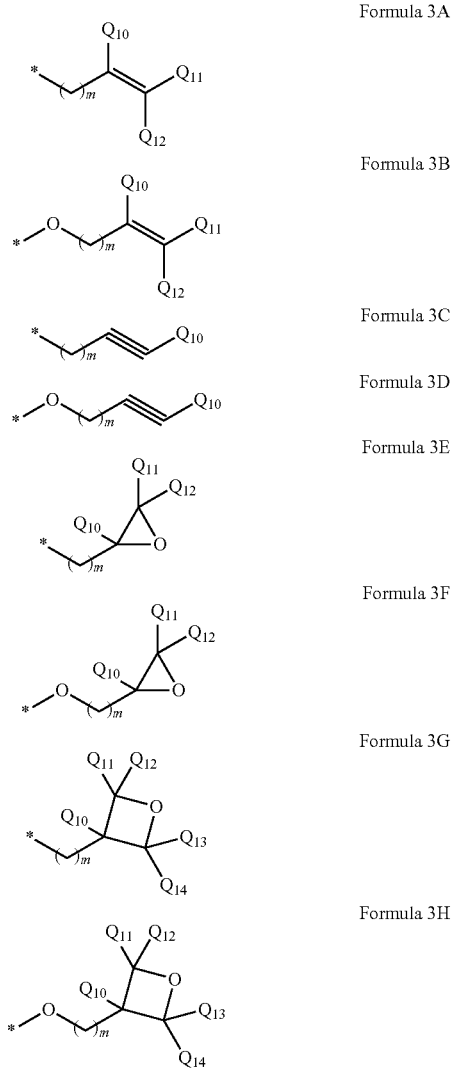

Formula 3A

Formula 3B

Formula 3C

Formula 3D

Formula 3E

Formula 3F

Formula 3G

Formula 3H

In Formulae 3A to 3G, $Q_{10}$ to $Q_{14}$ are defined as described above. In Formulae 3A to 3G, m is an integer of from 1 to 30, and the asterisks (*) represent the binding site with the naphthyl group of Formula 1. In Formulae 3, for example, m may be an integer of from 1 to 20 or an integer of from 1 to 10. Also for example, $Q_{10}$ through $Q_{14}$ may each be hydrogen.

In Formula 1, $Ar_1$ is a bivalent group -$(L_1)_n$-, wherein linking group $L_1$ may be selected from the group consisting of —N($Q_6$)—, a substituted or unsubstituted $C_6$-$C_{30}$ arylene group, a substituted or unsubstituted $C_3$-$C_{30}$ heteroarylene group, and any combination thereof. In this regard, n is an integer of from 1 to 20, and the individual $L_1$ groups in -$(L_1)_n$- may be the same or different. $Q_6$ is defined as described above with reference to $Q_1$.

For example, linking group $L_1$ may be selected from the group consisting of —N($Q_6$)—, a substituted or unsubstituted phenylene group, a substituted or unsubstituted pentalenylene group, a substituted or unsubstituted indenylene group, a substituted or unsubstituted naphthylene group, a substituted or unsubstituted azulenylene group, a substituted or unsubstituted heptalenylene group, a substituted or unsubstituted indacenylene group, a substituted or unsubstituted acenaphthylene group, a substituted or unsubstituted fluorenylene group, a substituted or unsubstituted phenalenylene group, a substituted or unsubstituted phenanthrenylene group, a substituted or unsubstituted anthracenylene group, a substituted or unsubstituted fluoranthenylene group, a substituted or unsubstituted triphenylenylene group, a substituted or unsubstituted pyrenylenylene group, a substituted or unsubstituted chrysenylene group, a substituted or unsubstituted naphthacenylene group, a substituted or unsubstituted picenylene group, a substituted or unsubstituted perylenylene group, a substituted or unsubstituted pentaphenylene group, a substituted or unsubstituted hexacenylene group, a substituted or unsubstituted pyrrolylene group, a substituted or unsubstituted pyrazolylene group, a substituted or unsubstituted imidazolylene group, a substituted or unsubstituted imidazolinylene group, a substituted or unsubstituted imidazopyridinylene group, a substituted or unsubstituted imidazopyrimidinylene group, a substituted or unsubstituted pyridinylene group, a substituted or unsubstituted pyrazinylene group, a substituted or unsubstituted pyrimidinylene group, a substituted or unsubstituted indolylene group, a substituted or unsubstituted purinylene group, a substituted or unsubstituted quinolinylene group, a substituted or unsubstituted phthalazinylene group, a substituted or unsubstituted indolizinylene group, a substituted or unsubstituted naphthyridinylene group, a substituted or unsubstituted quinazolinylene group, a substituted or unsubstituted cinnolinylene group, a substituted or unsubstituted indazolylene group, a substituted or unsubstituted carbazolylene group, a substituted or unsubstituted phenazinylene group, a substituted or unsubstituted phenanthridinylene group, a substituted or unsubstituted pyranylene group, a substituted or unsubstituted chromenylene group, a substituted or unsubstituted benzofuranylene group, a substituted or unsubstituted thiophenylene group, a substituted or unsubstituted benzothiophenylene group, a substituted or unsubstituted isothiazolylene group, a substituted or unsubstituted benzoimidazolylene group, a substituted or unsubstituted isoxazolylene group, and any combination thereof. Here, $Q_6$ may be selected from the group consisting of a hydrogen atom, a halogen atom, a hydroxyl group, an amino group, a cyano group, a carboxylic acid group, a substituted or unsubstituted $C_1$-$C_{10}$ alkyl group, a substituted or unsubstituted $C_1$-$C_{10}$ alkoxy group, a substituted or unsubstituted $C_6$-$C_{14}$ aryl group, and a substituted or unsubstituted $C_3$-$C_{14}$ heteroaryl group, and any combination thereof.

Exemplary, linking groups $L_1$ may be selected from the group consisting of —N($Q_6$)—, a phenylene group, a $C_1$-$C_{10}$ alkylphenylene group, a di($C_1$-$C_{10}$ alkyl)phenylene group, a ($C_6$-$C_{14}$ aryl)phenylene group, a di($C_6$-$C_{14}$ aryl)phenylene group, a carbazolylene group, a $C_1$-$C_{10}$ alkylcarbazolylene group, a di($C_1$-$C_{10}$ alkyl)carbazolylene group, a $C_6$-$C_{14}$ arylcarbazolylene group, a di($C_6$-$C_{14}$ aryl)carbazolylene group, a fluorenylene group, a $C_1$-$C_{10}$ alkylfluorenylene group, a di($C_1$-$C_{10}$ alkyl)fluorenylene group, a ($C_6$-$C_{14}$ aryl)fluorenylene group, a di($C_6$-$C_{14}$ aryl)fluorenylene group, a naphthylene group, a $C_1$-$C_{10}$ alkylnaphthylene group, a di($C_1$-$C_{10}$ alkyl)naphthylene group, a ($C_6$-$C_{14}$ aryl)naphthylene group, a di($C_6$-$C_{14}$ aryl)naphthylene group, an anthrylene group, a $C_1$-$C_{10}$ alkylanthrylene group, a di($C_1$-$C_{10}$ alkyl)anthrylene group, a ($C_6$-$C_{14}$ aryl)anthrylene group, a di($C_6$-$C_{14}$ aryl) anthrylene group, a pyridinylene group, a $C_1$-$C_{10}$ alkylpyridinylene group, a di($C_1$-$C_{10}$ alkyl)pyridinylene group, a ($C_6$-$C_{14}$ aryl)pyridinylene group, a di($C_6$-$C_{14}$ aryl)pyridinylene group, a quinolinylene group, a $C_1$-$C_{10}$ alkylquinolinylene group, a di($C_1$-$C_{10}$ alkyl)quinolinylene group, a ($C_6$-$C_{14}$ aryl) quinolinylene group, a di($C_6$-$C_{14}$ aryl)quinolinylene group, a benzoimidazolylene group, a $C_1$-$C_{10}$ alkylbenzoimidazolylene group, a di($C_1$-$C_{10}$ alkyl)benzoimidazolylene group, a ($C_6$-$C_{14}$ aryl)benzoimidazolylene group, a di($C_6$-$C_{14}$ aryl)benzoimidazolylene group, an imidazopyridinylene group, a $C_1$-$C_{10}$ alkylimidazopyridinylene group, a di($C_1$-$C_{10}$ alkyl) imidazopyridinylene group, a ($C_6$-$C_{14}$ aryl) imidazopyridinylene group, a di($C_6$-$C_{14}$ aryl) imidazopyridinylene group, an imidazopyrimidinylene group, a $C_1$-$C_{10}$ alkylimidazopyrimidinylene group, a di($C_1$-$C_{10}$ alkyl) imidazopyrimidinylene group, a ($C_6$-$C_{14}$ aryl) imidazopyrimidinylene group, a di($C_6$-$C_{14}$ aryl) imidazopyrimidinylene group, and any combination thereof, wherein $Q_6$ may be a substituted or unsubstituted $C_6$-$C_{14}$ aryl group (e.g., a phenyl group; a phenyl group substituted with at least one substituent selected from the group consisting of a halogen atom, a cyano group, an amino group, a hydroxyl group, a $C_1$-$C_{10}$ alkyl group, a $C_1$-$C_{10}$ alkoxy group, a $C_6$-$C_{14}$ aryl group, and any combination thereof; a naphthyl group; a naphthyl group substituted with at least one substituent selected from the group consisting of a halogen atom, a cyano group, an amino group, a hydroxyl group, a $C_1$-$C_{10}$ alkyl group, a $C_1$-$C_{10}$ alkoxy group, a $C_6$-$C_{14}$ aryl group, and any combination thereof; an anthracenyl group; an anthracenyl group substituted with at least one substituent selected from the group consisting of a halogen atom, a cyano group, an amino group, a hydroxyl group, a $C_1$-$C_{10}$ alkyl group, a $C_1$-$C_{10}$ alkoxy group, a $C_6$-$C_{14}$ aryl group, and any combination thereof; a fluorenyl group; a fluorenyl group substituted with at least one substituent selected from the group consisting of a halogen atom, a cyano group, an amino group, a hydroxyl group, a $C_1$-$C_{10}$ alkyl group, a $C_1$-$C_{10}$ alkoxy group, and a $C_6$-$C_{14}$ aryl group, and the like, and any combination thereof).

$Ar_1$ may be one selected from the group consisting of Formulae 4A to 4C below, but is not limited thereto.

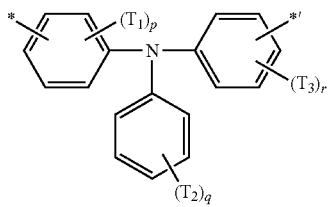

Formula 4A

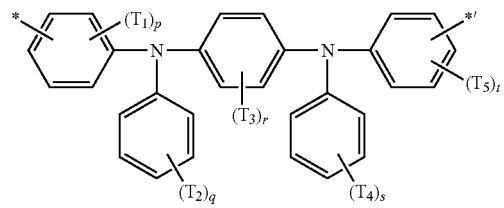

Formula 4B

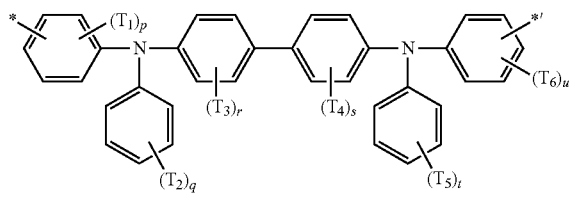

Formula 4C

In Formulae 4A to 4C, $T_1$ to $T_6$ may each be independently selected from the group consisting of a hydrogen atom, a halogen atom, a cyano group, an amino group, a hydroxyl group, a $C_1$-$C_{10}$ alkyl group, a $C_1$-$C_{10}$ alkoxy group, and a $C_6$-$C_{14}$ aryl group, wherein p, q, r, s, t, and u are each independently an integer of from 1 to 5.

In Formula 1, $Ar_2$ may be selected from the group consisting of a substituted or unsubstituted $C_6$-$C_{30}$ arylene group, a substituted or unsubstituted $C_3$-$C_{30}$ heteroarylene group, and any combination thereof.

For example, $Ar_2$ may be selected from the group consisting of a substituted or unsubstituted pyrrolylene group, a substituted or unsubstituted pyrazolylene group, a substituted or unsubstituted imidazolylene group, a substituted or unsubstituted imidazolinylene group, a substituted or unsubstituted imidazopyridinylene group, a substituted or unsubstituted imidazopyrimidinylene group, a substituted or unsubstituted pyridinylene group, a substituted or unsubstituted pyrazinylene group, a substituted or unsubstituted pyrimidinylene group, a substituted or unsubstituted indolylene group, a substituted or unsubstituted purinylene group, a substituted or unsubstituted quinolinylene group, a substituted or unsubstituted phthalazinylene group, a substituted or unsubstituted indolizinylene group, a substituted or unsubstituted naphthyridinylene group, a substituted or unsubstituted quinazolinylene group, a substituted or unsubstituted cinnolinylene group, a substituted or unsubstituted indazolylene group, a substituted or unsubstituted carbazolylene group, a substituted or unsubstituted phenazinylene group, a substituted or unsubstituted phenanthridinylene group, a substituted or unsubstituted pyranylene group, a substituted or unsubstituted chromenylene group, a substituted or unsubstituted benzofuranylene group, a substituted or unsubstituted thiophenylene group, a substituted or unsubstituted benzothiophenylene group, a substituted or unsubstituted isothiazolylene group, a substituted or unsubstituted benzoimidazolylene group, a substituted or unsubstituted isoxazolylene group, a group of Formula 5A, a group of Formula 5B, a group of Formula 5C, a group of Formula 5D, a group of Formula 5E, a group of Formula 5F, a group of Formula 5G, and any combination thereof.

Formula 5A
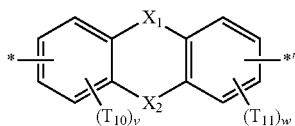

Formula 5B
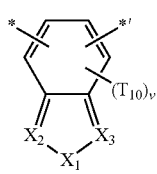

Formula 5C
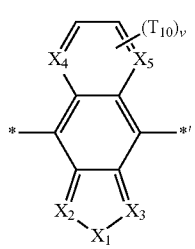

Formula 5D
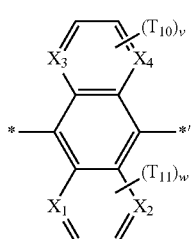

Formula 5E
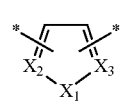

Formula 5F
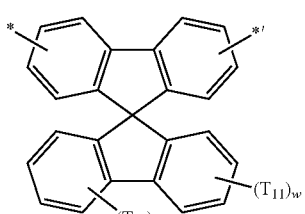

Formula 5G
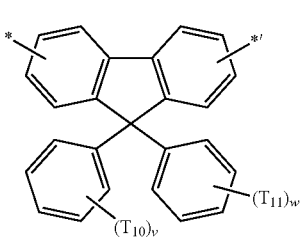

In Formulae 5A to 5G, $X_1$ and $X_5$ may each be independently selected from the group consisting of

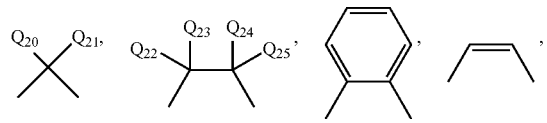

—O—, —S—, —N=, —N($Q_{26}$)—, —C($Q_{27}$)=, and —C($Q_{28}$)($Q_{29}$)—, wherein $Q_{20}$ to $Q_{29}$, $T_{10}$ and $T_{11}$ may be each independently selected from the group consisting of a hydrogen atom, a substituted or unsubstituted $C_1$-$C_{30}$ alkyl group, a substituted or unsubstituted $C_1$-$C_{30}$ alkoxy group, a substituted or unsubstituted $C_6$-$C_{30}$ aryl group, a substituted or unsubstituted $C_5$-$C_{30}$ heteroaryl group, and any combination thereof, and v and w may be each independently an integer of from 1 to 3. Please note also that unassigned bonds used herein represent points of attachment to the associated organic group.

For example, $Ar_2$ may be one selected from the group consisting of Formulae 5A to 5G described above.

$Ar_2$ may be one selected from the group consisting of Formulae 6A to 6H below, but is not limited thereto.

Formula 6A
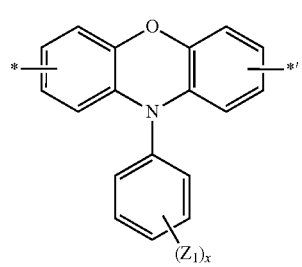

Formula 6B
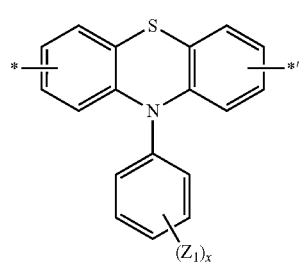

Formula 6C
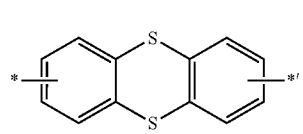

Formula 6D
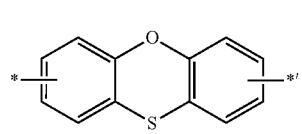

Formula 6E
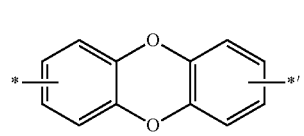

Formula 6F
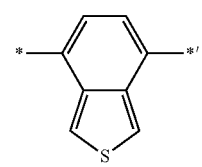

-continued

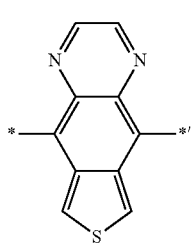
Formula 6G

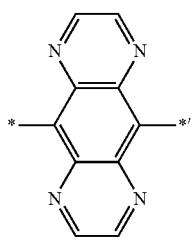
Formula 6H

Here, $Z_1$ may be selected from the group consisting of a hydrogen atom, a halogen atom, a hydroxyl group, a cyano group, an amino group, a substituted or unsubstituted $C_1$-$C_{30}$ alkyl group, a substituted or unsubstituted $C_1$-$C_{30}$ alkoxy group, a substituted or unsubstituted $C_6$-$C_{30}$ aryl group, a substituted or unsubstituted $C_3$-$C_{30}$ heteroaryl group, and any combination thereof, and x is an integer of from 1 to 5.

For example, $Z_1$ may be selected from the group consisting of a hydrogen atom, a halogen atom, a hydroxyl group, a cyano group, an amino group, a $C_1$-$C_{10}$ alkyl group, a $C_1$-$C_{10}$ alkoxy group, a $C_6$-$C_{14}$ aryl group, a $C_3$-$C_{14}$ heteroaryl group, and any combination thereof.

According to an embodiment, $Ar_2$ may be of Formula 6A in which $Z_1$ is a $C_1$-$C_{10}$ alkoxy group, but is not limited thereto.

In Formula 1, a, b, and c may each be independently a real number satisfying 0≤a≤0.99, 0<b≤0.99, and 0<c≤0.99, and a+b+c=1. That is, a may be 0. If a is 0, the cross-linkable polymer of Formula 1 does not include a repeating unit $Ar_1$. Here, a, b, and c may be determined within the range describe above in consideration of desired properties of the cross-linkable polymer.

In the cross-linkable polymer of Formula 1 according to an embodiment, $Ar_1$ may be one selected from the group consisting of Formulae 4A to 4C, $R_{10}$ to $R_{19}$ may be hydrogen, $R_1$ and $R_2$ may be each independently selected from the group consisting of a $C_1$-$C_{30}$ alkyl group including at least one cross-linkable moiety, a $C_1$-$C_{30}$ alkoxy group including at least one cross-linkable moiety, a $C_6$-$C_{30}$ aryl group including at least one cross-linkable moiety, a $C_6$-$C_{30}$ aryloxy group including at least one cross-linkable moiety, a $C_3$-$C_{30}$ heteroaryl group including at least one cross-linkable moiety, and any combination thereof, and $Ar_2$ may be one selected from the group consisting of Formulae 6A to 6H.

In the cross-linkable polymer of Formula 1 according to another embodiment, $Ar_1$ may be one selected from the group consisting of Formulae 4A to 4C, $R_{10}$ to $R_{19}$ may be hydrogen, $R_1$ and $R_2$ may each be independently selected from the group consisting of a $C_1$-$C_{30}$ alkyl group including at least one cross-linkable moiety, a $C_1$-$C_{30}$ alkoxy group including at least one cross-linkable moiety, a $C_6$-$C_{30}$ aryl group including at least one cross-linkable moiety, a $C_6$-$C_{30}$ aryloxy group including at least one cross-linkable moiety, a $C_3$-$C_{30}$ heteroaryl group including at least one cross-linkable moiety, and any combination thereof, wherein the cross-linkable moiety may be one selected from the group consisting of Formulae 2A to 2D, and $Ar_2$ may be one selected from the group consisting of Formulae 6A to 6H.

In the cross-linkable polymer of Formula 1 according to another embodiment, $Ar_1$ may be one selected from the group consisting of Formulae 4A to 4C, $R_{10}$ to $R_{19}$ may be hydrogen, $R_1$ and $R_2$ may be each independently a cross-linkable group one selected from the group consisting of Formulae 3A to 3H, and $Ar_2$ may be one selected from the group consisting of Formulae 6A to 6H.

The cross-linkable polymer of Formula 1 according to another embodiment may be of Formula 1A below.

Formula 1A

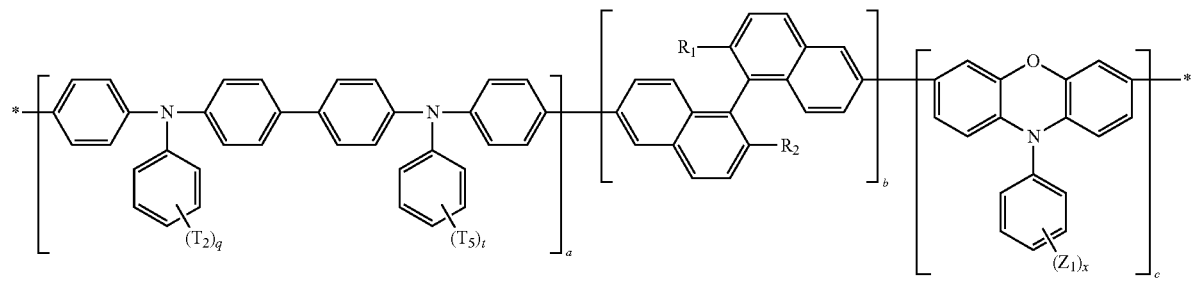

In Formula 1A, $T_2$, $T_5$ and $Z_1$ may be each independently selected from the group consisting of a hydrogen atom, a halogen atom, a cyano group, an amino group, a hydroxyl group, a $C_1$-$C_{10}$ alkyl group, a $C_1$-$C_{10}$ alkoxy group, and a $C_6$-$C_{14}$ aryl group; q, t, and x may be each independently an integer of from 1 to 5; $R_1$ and $R_2$ may be each independently selected from the group consisting of a $C_1$-$C_{30}$ alkyl group including at least one cross-linkable moiety, a $C_1$-$C_{30}$ alkoxy group including at least one cross-linkable moiety, a $C_6$-$C_{30}$ aryl group including at least one cross-linkable moiety, a $C_6$-$C_{30}$ aryloxy group including at least one cross-linkable moiety, a $C_3$-$C_{30}$ heteroaryl group including at least one cross-linkable moiety, and any combination thereof, wherein the cross-linkable moiety may be one selected from the group consisting of Formulae 2A to 2D For example, the cross-linkable moiety in Formula 1A may be of Formula 2A-1 or 2B-1, but is not limited thereto.

For example, in Formula 1A, $R_1$ and $R_2$ may be each independently one selected from the group consisting of Formulae 3A to 3H, but are not limited thereto.

The cross-linkable polymer of Formula 1 may have a weight average molecular weight (Mw) of about 2,000 to about 1,000,000 g/mol based on universal calibration using polystyrene standards (for example, as determined using gel permeation chromatography using a crosslinked styrene-divinylbenzene column) and a polydispersity index ("PDI") of about 1.5 to about 5, but is not limited thereto. The weight average molecular weight and the PDI may be selected by considering the structure of an organic light emitting device including the cross-linkable polymer or desired characteristics of the organic light emitting device, and associated properties of the cross-linkable polymer such as, for example, viscosity, absorbance wavelength, emission wavelength, and the like.

The cross-linkable polymer of Formula 1 may be cross-linked by the cross-linkable group including the cross-linkable moiety as described above. The cross-linking may be conducted by various mechanisms such as addition reaction and condensation reaction according to the selected cross-linkable moiety. In addition, a repeating unit $Ar_1$ and/or $Ar_2$ in the cross-linkable polymer of Formula 1 may provide a suitable carrier (i.e., hole) transporting capability, and thus the cross-linked material of the cross-linkable polymer is suitably used in an organic layer that is interposed between a pair of electrodes of an organic light emitting device. Thus, an organic light emitting device including the cross-linked material may have excellent performance in properties such as, for example, high brightness, high efficiency, and high current density.

Throughout the specification, examples of the unsubstituted $C_1$-$C_{30}$ alkyl group include a methyl group, an ethyl group, a propyl group, an isobutyl group, a sec-butyl group, a pentyl group, an iso-amyl group a hexyl group, and any combination thereof. In the substituted $C_1$-$C_{30}$ alkyl group, at least one of the hydrogen atoms is substituted with a halogen atom, a $C_1$-$C_{30}$ alkyl group, a $C_1$-$C_{30}$ alkoxy group, a $C_1$-$C_{10}$ alkylamino group, a $C_6$-$C_{14}$ arylamino group, a $C_6$-$C_{30}$ aryl group, a $C_3$-$C_{30}$ heteroaryl group, a hydroxy group, a nitro group, a cyano group, an amino group, an amidino group, hydrazine, hydrazone, a carboxyl group, a sulfonic acid group, a phosphoric acid group, or the like, and any combination thereof.

Throughout the specification, examples of the unsubstituted $C_1$-$C_{30}$ alkoxy group include a methoxy group, an ethoxy group, a propoxy group, an isobutyloxy group, a sec-butyloxy group, a pentyloxy group, an iso-amyloxy group, a hexyloxy group, and any combination thereof. In the substituted $C_1$-$C_{30}$ alkoxy group, at least one of the hydrogen atoms is substituted with the substituents described above with reference to the $C_1$-$C_{30}$ alkyl group.

Throughout the specification, the unsubstituted $C_6$-$C_{30}$ aryl group refers to a carbocyclic aromatic system including one or more rings. When the $C_6$-$C_{30}$ aryl group includes two or more rings, these rings may be attached to each other using a pendent method or may be fused together. The term 'aryl' refers to an aromatic system, such as for example, phenyl, naphthyl, or tetrahydronaphthyl. In the substituted $C_6$-$C_{30}$ aryl group, at least one of the hydrogen atoms is substituted with the substituents described above with reference to the $C_1$-$C_{30}$ alkyl group.

Throughout the specification, the unsubstituted $C_6$-$C_{30}$ aryloxy group is a substituent of the formula —$OQ_{30}$, wherein $Q_{30}$ is defined as described above with reference to the substituted or unsubstituted $C_6$-$C_{30}$ aryl group.

Throughout the specification, the unsubstituted $C_3$-$C_{30}$ heteroaryl group refers to a monovalent monocyclic ring compound that has 1, 2, or 3 hetero atoms and 2 to 30 ring atoms, wherein the hetero atom is selected from nitrogen (N), oxygen (O), phosphorous (P) and sulfur (S), and the other ring atoms are carbon (C). When the $C_3$-$C_{30}$ heteroaryl group has two or more rings, these rings may be attached to each other using a pendent method or fused together. Examples of the heteroaryl group include pyridyl, thienyl, and furyl. In the substituted $C_3$-$C_{30}$ heteroaryl group, at least one of the hydrogen atoms is substituted with the substituents described above with reference to the $C_1$-$C_{30}$ alkyl group.

Throughout the specification, the substituted or unsubstituted $C_6$-$C_{30}$ arylene group is a bivalent linking group having the same structure as that of the substituted or unsubstituted $C_6$-$C_{30}$ aryl group, and the substituted or unsubstituted $C_3$-$C_{30}$ heteroarylene group is a bivalent linking group having the same structure as that of the $C_3$-$C_{30}$ heteroaryl group.

Throughout the specification, the substituted or unsubstituted $C_6$-$C_{30}$ aryl group and the substituted or unsubstituted $C_3$-$C_{30}$ heteroaryl group would have been obvious to one of ordinary skill in the art with reference to the substituted or unsubstituted $C_6$-$C_{30}$ arylene group and $C_3$-$C_{30}$ heteroarylene group.

Throughout the specification, * and *' refer to a binding site with any adjacent atom, moiety, substituent, or the like, unless otherwise stated.

The cross-linkable polymer of Formula 1 may be synthesized by a known method in the art such as, for example, Suzuki coupling of boronate esters with aryl iodides by a palladium catalyst, or Yamamoto coupling of zinc salts with aryl iodides by a palladium catalyst, as would be understood by those skilled in the art with reference to embodiments disclosed herein.

A cross-linked material of the cross-linkable polymer of Formula 1 is provided.

The cross-linked material may be a product obtained by cross-linking the cross-linkable moieties by heat and/or light applied to the cross-linkable polymer. It will be understood that while intra-polymer crosslinking may occur, crosslinking refers to interchain crosslinking of adjacent cross-linkable polymer chains to form a crosslinked network.

For example, the cross-linked material, e.g., a part of the cross-linked material, may be of Formula 10 below.

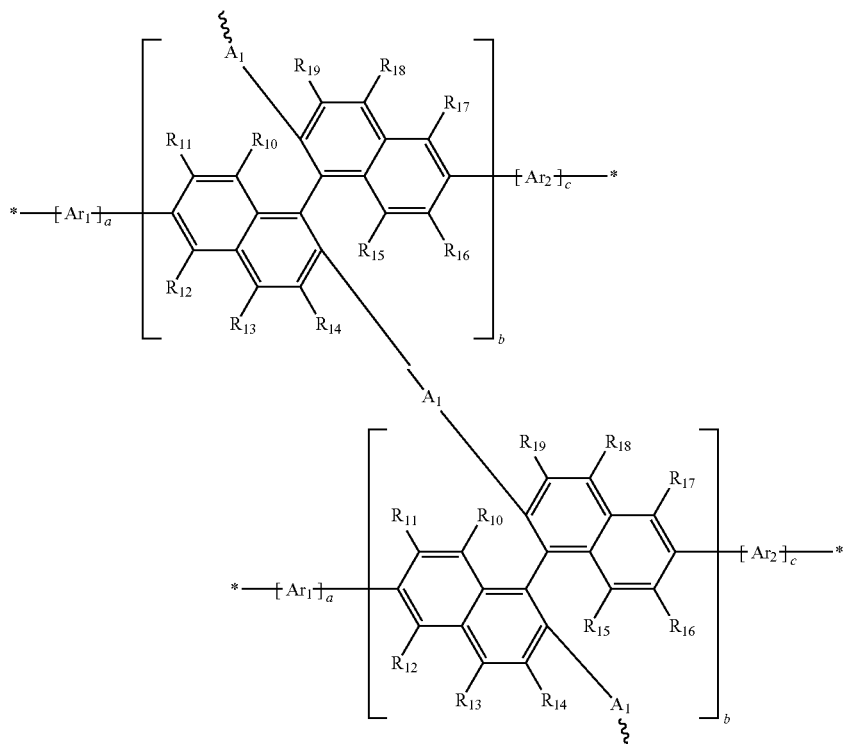

Formula 10

In Formula 10, $R_{10}$ to $R_{19}$ (except for the cross-linkable group in the definition of $R_{10}$ to $R_{19}$), $Ar_1$, $Ar_2$, a, b, and c are defined as described above. Also in Formula 10, $A_1$ may be a bivalent linking group as a residual group that is generated by the cross-linking of cross-linkable moieties of $R_1$ and/or $R_2$ as described above.

For example, $A_1$ may be a linking group -$(L_2)_{d}$-, and $L_2$ may be selected from the group consisting of —O—, a substituted or unsubstituted $C_2$-$C_{30}$ alkylene group, a substituted or unsubstituted $C_2$-$C_{30}$ alkenylene group, a substituted or unsubstituted $C_6$-$C_{30}$ arylene group, and a substituted or unsubstituted $C_3$-$C_{30}$ heteroarylene group, wherein the individual linking groups $L_2$ of -$(L_2)_{d}$- may be the same or different, and d may be an integer of 1 to 60.

For example, if both of $R_1$ and $R_2$ are of Formula 3A, wherein m is 3 and $Q_{10}$ to $Q_{12}$ are hydrogen, $A_1$ may be —O—$(CH_2)_{10}$—O—.

The structure of $A_1$ may vary according to the reaction mechanism associated with the cross-linkable moiety according to the structure of the cross-linkable polymer of Formula 1.

In Formula 10, the ⌇ indicates an adjacent, attached polymer chain.

It will be appreciated that a part of the cross-linked material of the cross-linkable polymer of Formula 1 may be of Formula 10.

The cross-linked material may have a complicated, branched structure such as a net type or ladder type structure according to the amount of the cross-linkable moiety and the degree of cross-linking may also vary according to the concentration of the cross-linkable polymer or the amount of heat and/or light applied to the cross-linkable polymer.

The weight average molecular weight and a polydispersity index (PDI) of the cross-linked material of Formula 10 are thus based on the weight average molecular weight and the PDI of the cross-linkable polymer, and the degree of crosslinking.

Since the cross-linked material of the cross-linkable polymer of Formula 1 is a super polymer including a repeating unit such as $Ar_1$ and/or $Ar_2$ capable of providing improved electrical performance and having a net type or ladder type structure formed by the cross-linking by the cross-linkable moieties, the cross-linked material is not substantially insoluble in a general organic solvent, and may be used in an organic layer of an organic light emitting device that is interposed between a pair of electrodes. For example, the cross-linked material of the cross-linkable polymer of Formula 1 may be efficiently included in an organic light emitting device manufactured based on a wet process.

The organic light emitting device may include: a substrate; a first electrode; a second electrode; and a first layer that is interposed between opposing surfaces of the first electrode and the second electrode, the first layer including a cross-linked material of the cross-linkable polymer of Formula 1.

The cross-linked material is defined as described above.

The first layer may function as a hole transport layer ("HTL").

In the organic light emitting device, an emission layer ("EML") may further be formed on a surface of the first layer between either the first or second electrodes. The EML may be formed using a wet process.

The EML may include a polymer of Formula 21 below, but is not limited thereto.

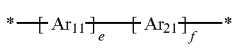

Formula 21

In Formula 21, $Ar_{11}$ and $Ar_{12}$ are each independently selected from the group consisting of a substituted or unsubstituted $C_6$-$C_{30}$ arylene group; a substituted or unsubstituted $C_4$-$C_{30}$ heteroarylene group; and a system including at least two selected from the group consisting of a substituted or unsubstituted $C_6$-$C_{30}$ arylene group and a substituted or unsubstituted $C_4$-$C_{30}$ heteroarylene group which are connected to each other by a single bond or by a linking group of formula-$N(R_{51})$—, wherein $R_{51}$ is a hydrogen atom, a substituted or unsubstituted $C_1$-$C_{30}$ alkyl group, or a substituted or unsubstituted $C_6$-$C_{30}$ aryl group; and e and f are each independently a real number where $0 < e \leq 0.99$ and $0 < f \leq 0.99$, and $e+f=1$.

For example, the EML may include a polymer of Formula 21A or 21B, but is not limited thereto.

injection layer ("HIL"), a hole blocking layer ("HBL"), an electron transport layer ("ETL"), and an electron injection layer ("EIL") between the first electrode and the second electrode in addition to the first layer which functions as, for example, the HTL, and the EML.

According to another embodiment, a method of preparing the organic light emitting device may include: forming a first electrode on a substrate; forming a first layer including a cross-linked material of a cross-linkable polymer of Formula 1 by providing a first layer-forming composition including the cross-linkable polymer on the first electrode, and heat-treating the cross-linkable polymer to cross-link the cross-linkable polymer; and forming a second electrode on the first layer. Heat treating is accomplished under conditions suitable for cross-linking the cross-linkable polymer, and may be done at a temperature of, for example, up to 300° C., optionally under inert atmosphere.

If the organic light emitting device further includes an EML on the first layer (e.g., where the first layer is an HTL),

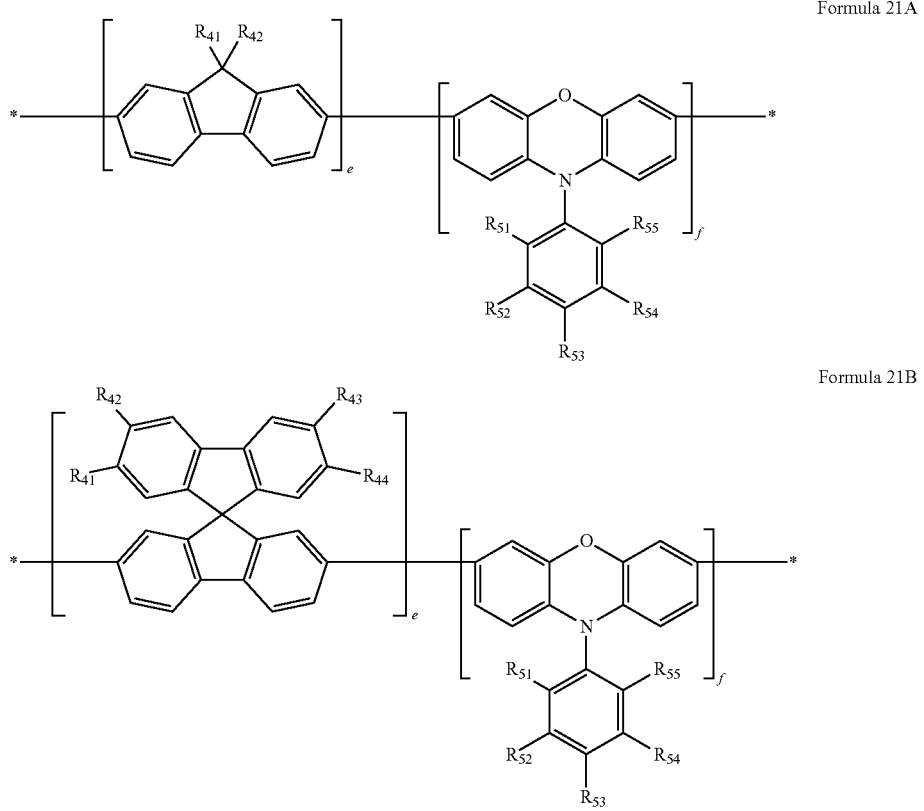

Formula 21A

Formula 21B

In Formulae 21A and 21B, $R_{41}$ to $R_{44}$ are defined as described above in connection with $T_1$, and $R_{51}$ to $R_{55}$ are defined as described above in connection with $Z_1$.

For example, $R_{41}$ to $R_{44}$ in Formula 21A and 21B may be each independently a hydrogen atom, a $C_1$-$C_{10}$ alkyl group, a $C_1$-$C_{10}$ alkoxy group (e.g., —$OC_8H_{17}$), or a $C_6$-$C_{14}$ aryl group (e.g., a phenyl group or naphthyl group), but are not limited thereto.

For example, in Formulae 21A and 21B, $R_{51}$, $R_{52}$, $R_{54}$, and $R_{55}$ may be hydrogen, and $R_{53}$ may be a $C_1$-$C_{10}$ alkoxy group (e.g., —$OC_8H_{17}$), but are not limited thereto.

The organic light emitting device may further include at least one layer selected from the group consisting of a hole the method may further include forming an EML by depositing an EML-forming composition on a surface of the first layer before forming the second electrode. In this regard, the first layer-forming composition may further include a first solvent in addition to the cross-linkable polymer, and the EML-forming composition may further include a second solvent in addition to an EML-forming material.

The conditions for the heat-treatment in the forming the first layer may be selected from the conditions suitable for cross-linking of the cross-linkable polymer of Formula 1. The conditions for the heat-treatment may vary according to the structure of Formula 1. For example, the heat-treatment may be performed at a temperature of from about 12° C. to about 25° C. The heat treatment may carried out for about 10 minutes to about 1 hour.

The cross-linked material so formed by heat-treatment of the cross-linkable polymer of Formula 1 may be substantially insoluble in the second solvent that is contained in the EML-forming composition.

Throughout the specification, the "the cross-linked material of the cross-linkable polymer of Formula 1 is substantially insoluble in the second solvent" refers to that 10 wt % or less of the cross-linked material of the cross-linkable polymer of Formula 1 is soluble in the second solvent in a standard state (at 1 atm and at 25° C.), so that an intermixing layer, in which the cross-linked material and the EML-forming material are mixed, is not substantially formed between the first layer including the cross-linked material and the EML.

The intermixing layer may be formed in the interface between the first layer and the EML since a part of the first layer that has already been formed is dissolved by the second solvent that is contained in the EML-forming composition when the EML is formed by a wet process. Due to the intermixing layer, the performance of the organic light emitting device may deteriorate. For example, the thickness of the first layer may decrease by the intermixing layer.

However, since the cross-linked material contained in the first layer is insoluble in a general organic solvent, for example, the second solvent contained in the EML-forming composition, the intermixing layer is not substantially formed between the first layer and the EML, so that an organic light-emitting device having excellent performance may be obtained.

For example, 8 wt % or less, 6 wt % or less, 4 wt % of less, 2 wt % or less, 1 wt % or less, 0.5 wt % or less, 0.1 wt % or less, 0.05 wt % or less, or 0.001 wt % or less of the cross-linked material of the cross-linkable polymer of Formula 1 based on 100 wt % of the cross-linked material may be soluble in the second solvent in a standard state (at 1 atm and at 25° C.).

For example, the cross-linked material of the cross-linkable polymer of Formula 1 may be insoluble, i.e., completely insoluble, in the second solvent in a standard state (at 1 atm and at 25° C.).

The first solvent contained in the first layer-forming composition may be chlorobenzene, toluene, xylene, chloroform, tetrahydrofuran, or the like, or any combination thereof, but is not limited thereto. Meanwhile, the second solvent contained in the EML-forming composition may be toluene, xylene, chlorobenzene, or the like, or any combination thereof, but is not limited thereto.

FIG. 1 is a schematic cross-sectional view of an organic light emitting device 10 according to an embodiment. The organic light emitting device 10 includes a substrate 11, a first electrode 12 disposed on a surface of substrate 11, an HIL 13 disposed on a surface of first electrode 12 opposite the substrate 11, a first layer 14 disposed on a surface of HIL 13 opposite first electrode 12, an EML 15 disposed on a surface of first layer 14 opposite HIL 13, an EIL 16 disposed on a surface of EML 15 opposite first layer 14, and a second electrode 17 disposed on a surface of EIL 16 opposite EML 15. The first layer 14 may function as a HTL. Hereinafter, the organic light emitting device 10 and a method of manufacturing the organic light emitting device 10 will be described in detail.

First, a first electrode-forming material having a high work function is formed on the substrate 11 using deposition, ion-plating, plating, sputtering, or the like to form the first electrode 12. The first electrode 12 may be an anode capable of injecting holes or a cathode capable of injecting electrons. The substrate 10, which may be any substrate that is commonly used in organic light emitting devices, may be a glass substrate or a transparent plastic substrate with excellent mechanical strength, thermal stability, transparency, surface smoothness, handling convenience, and water-resistance. Examples of the first electrode-forming material include a metal oxide, a metal sulfite, or a metal, all of which have high electrical conductivity. In generally, theses materials are used to form a thin film. Examples of the first electrode-forming material may include indium oxide, zinc oxide, tin oxide, indium tin oxide ("ITO"), indium zinc oxide ("IZO"), gold (Au), platinum (Pt), silver (Ag), copper (Cu), alloys thereof, or the like, or any combination thereof. In addition, polyaniline or derivatives thereof, polythiophene or derivatives thereof, or any combination thereof, may be used as the first electrode-forming material. The first electrode 12 may have a single or multi-layered structure and may include at least two different materials. The thickness of the first electrode 12 may vary according to light transmittance and electrical conductivity. For example, the first electrode 12 may have a thickness of about 10 nm to about 10 μm.

Then, if the first electrode 12 is an anode, the HIL 13 is formed on the first electrode 12. The HIL 13 may be formed on the surface of first electrode 12 using various methods such as vacuum deposition, spin coating, casting, inkjet printing, Langmuir-Blodgett ("LB") deposition, or the like.

When the HIL 13 is formed using vacuum deposition, the deposition conditions may vary according to a compound that is used to form the HIL 13, and the structure and thermal characteristics of the HIL 13 to be formed. For example, the deposition conditions may include a deposition temperature of 100 to 500° C., a vacuum pressure of $10^{-8}$ to $10^{-3}$ torr, and a deposition rate of 0.01 to 100 Å/sec.

When the HIL 13 is formed by spin coating, coating conditions may vary according to a compound that is used to form the HIL 13, and the desired structure and thermal properties of the HIL 13 to be formed. In general, however, the coating speed may be from about 2000 to about 5000 rpm, and the temperature for heat-treatment, which is performed to remove a solvent after coating, may be from about 80 to about 30° C.

The HIL 13 may be formed of any material that is commonly used to form a HIL. Examples of the HIL-forming material include a phthalocyanine compound such as copper phthalocyanine, 4,4',4"-tris(3-methylphenylphenylamino)triphenylamine ("m-MTDATA"), N,N'-di(1-naphthyl)-N,N'-diphenylbenzidine ("NPB"), 4,4',4"-tris(N,N-diphenylamino)triphenylamine ("TDATA"; see formula below), 4,4',4"-tris(N-(2-naphthyl)-N-phenylamino)-triphenylamine ("2T-NATA"; see formula below), polyaniline/dodecylbenzenesulfonic acid ("Pani/DBSA"), poly(3,4-ethylenedioxythiophene)/poly(4-styrenesulfonate) ("PEDOT/PSS"), polyaniline/camphor sulfonic acid ("Pani/CSA"), and polyaniline/poly(4-styrenesulfonate) ("PANI/PSS"), or a combination thereof, but are not limited thereto.

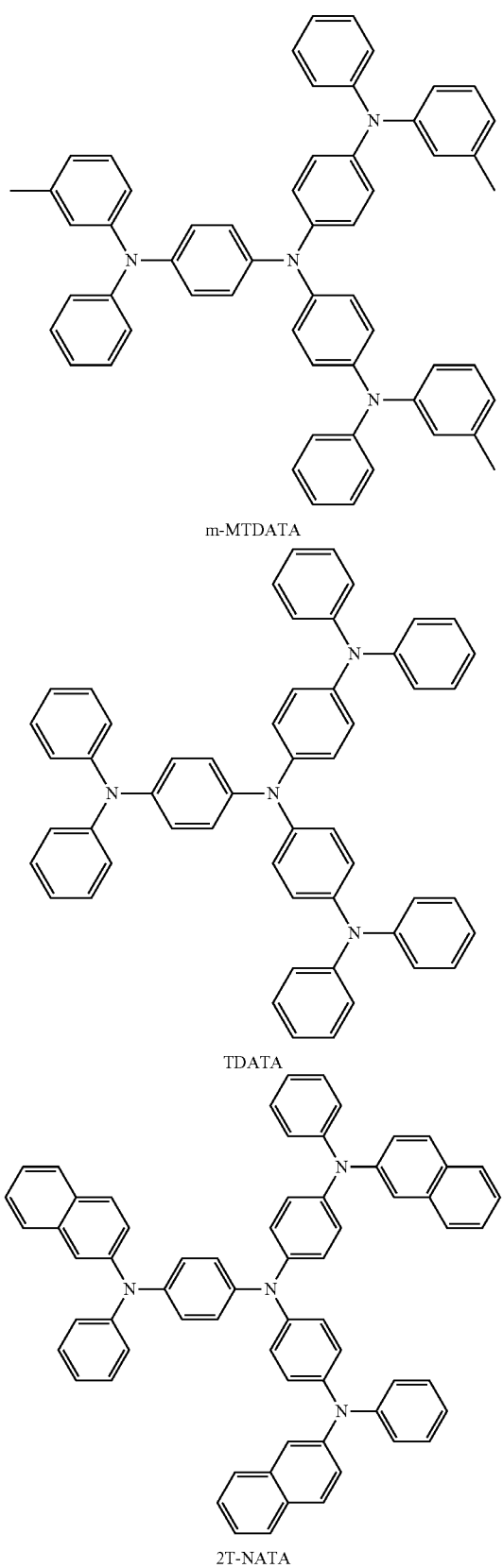

m-MTDATA

TDATA

2T-NATA

The thickness of the HIL 13 may be of about 100 to about 10,000 Å, and for example, about 100 to about 1,000 Å. When the thickness of the HIL 13 is within the above range, the HIL 13 may have excellent hole injection properties without a substantial increase in driving voltage.

A first layer 14 including the cross-linked material of the cross-linkable polymer of Formula 1 is formed on the HIL 13. The first layer 14 may function as a HTL. The first layer 14 may be formed by providing a first layer-forming composition that includes the cross-linkable polymer of Formula 1 and the first solvent such as chloroform and chlorobenzene onto the HIL 13 and heat-treating the composition under conditions suitable for cross-linking of the cross-linkable moieties of the cross-linkable polymer. The first layer-forming composition may be applied to the HIL 13 using various known methods such as spin coating, casting, and inkjet printing. The first solvent and the conditions for the heat-treatment are described above.

The thickness of the first layer 14 functioning as the HTL may be of about 50 to about 1,000 Å, for example, about 100 to about 600 Å. When the thickness of the first layer 14 is within this range, the first layer 14 may have excellent hole transporting ability without a substantial increase in driving voltage. Meanwhile, since the first layer 14 is not soluble in the second solvent contained in the EML-forming composition, the thickness of the first layer 14 may be maintained after the EML 15 is formed.

Then, the EML 15 may be formed on the first layer 14 by spin coating, casting, inkjet printing, nozzle printing, screen printing, slit coating, Langmuir-Blodgett (LB) deposition, or the like. When the EML 15 is formed using spin coating, the conditions for the coating may be similar to those for the formation of the HIL 13, although the conditions for coating may vary according to the material that is used to form the EML 15.

The EML 15 may include the polymer of Formula 21 as described above.

The thickness of the EML 15 may be of about 100 to about 1,000 Å, for example, about 300 to about 900 Å. When the thickness of the EML 15 is within the above range, the EML 15 may have excellent emission characteristics without a substantial increase in driving voltage.

Meanwhile, although not shown in FIG. 1, a hole blocking layer (HBL) and an electron transfer layer (ETL) may further be formed on a surface of the EML 15 opposite the first layer 14.

The HBL may prevent diffusion of triplet excitons or holes of the EML 15 into the second electrode 17, or the like. The HBL may be formed by vacuum deposition, spin coating, casting, LB deposition, or the like. When the HBL is formed by using vacuum deposition or spin coating, the deposition and coating conditions may be similar to those for formation of the HIL 13, although the deposition and coating conditions may vary according to a compound that is used to form the HBL. Any known hole blocking materials, for example, oxadiazole derivatives, triazole derivatives, phenanthroline derivatives, or BCP may be used to form the HBL.

The thickness of the HBL may be of about 50 to about 1,000 Å, for example, about 100 to about 300 Å. When the thickness of the HBL is within the range described above, the HBL may have excellent hole blocking capability.

Then, the ETL may be formed on the surface of the HBL or on the surface of the EML 15 (instead of the HBL) using various methods such as vacuum deposition, spin coating, or casting. When the ETL is formed using vacuum deposition or spin coating, the deposition and coating conditions may be similar to those for formation of the HIL 13, although the deposition and coating conditions may vary according to a compound that is used to form the ETL. The ETL-forming material may be any known material that stably transports electrons injected from an electron injection electrode, that is, a cathode. For example, the ETL-forming material may be any known electron-transfer material such as a quinoline derivative or 4,7-diphenyl-1,10-phenanthroline ("Bphen").

The thickness of the ETL may be of about 100 to about 1,000 Å, for example, about 200 to about 500 Å. If the thickness of the ETL is within the above range, the ETL may have excellent electron transport properties without a substantial increase in driving voltage.

Then, an EIL 16 may be formed on a surface of the ETL or the EML 16. The EIL 16 may be formed of LiF, NaCl, CsF, $Li_2O$, BaO, $BaF_2$, or the like, or a combination of these, or any such electron injection layer material known in the art. The conditions for deposition of the EIL 16 are similar to those for formation of the HIL 13, although the deposition conditions may vary according to a material that is used to form the EIL 16.

The thickness of the EIL 16 may be from about 1 to about 100 Å, for example, about 5 to about 50 Å. When the thickness of the EIL 16 is within the range described above, an excellent electron injection ability of the EIL 16 may be obtained without a substantial increase in driving voltage.

Finally, the second electrode 17 may be formed on the EIL 16. The second electrode 17 may be formed using the method described above in conjunction with the first electrode 12. The second electrode 17 may constitute a cathode or an anode. If the second electrode 17 is used as a cathode, a low work function material may be used. For example, an alkali metal such as lithium (Li), sodium (Na), potassium (K), rubidium (Rb), and cesium (Cs); an alkaline earth metal such as beryllium (Be), magnesium (Mg), calcium (Ca), strontium (Sr), and barium (Ba); metal such as aluminum (Al), scandium (Sc), vanadium (V), zinc (Zn), yttrium (Y), indium (In), cerium (Ce), samarium (Sm), europium (Eu), terbium (Tb), and ytterbium (Yb); an alloy formed of at least two thereof; an alloy formed of at least one selected from the group consisting of the elements described above and at least one selected from the group consisting of gold (Au), silver (Ag), platinum (Pt), copper (Cu), manganese (Mn), titanium (Ti), cobalt (Co), nickel (Ni), tungsten (W), and tin (Sn); graphite; graphite interlayer compounds, or a combination comprising at least one of the foregoing, may be used. The alloy may be Mg—Ag alloy, Mg—In alloy, Mg—Al alloy, In—Ag alloy, Li—Al alloy, Li—Mg alloy, Li—In alloy, Ca—Al alloy, or the like, or a combination comprising at least one of the foregoing. In addition, the second electrode 17 may include a single layer or at least two layers. The second electrode 17 may exclusively contain one material or may include at least two different materials. The second electrode 17 may be implemented in various forms, such as a transparent, semitransparent or reflective electrode. The thickness of the second electrode 17 may be of about 10 nm to about 10 μm, but is not limited thereto.

EXAMPLES

Synthesis Example 1

Synthesis of Compound A

Compound A is synthesized according to Reaction Scheme 1 below:

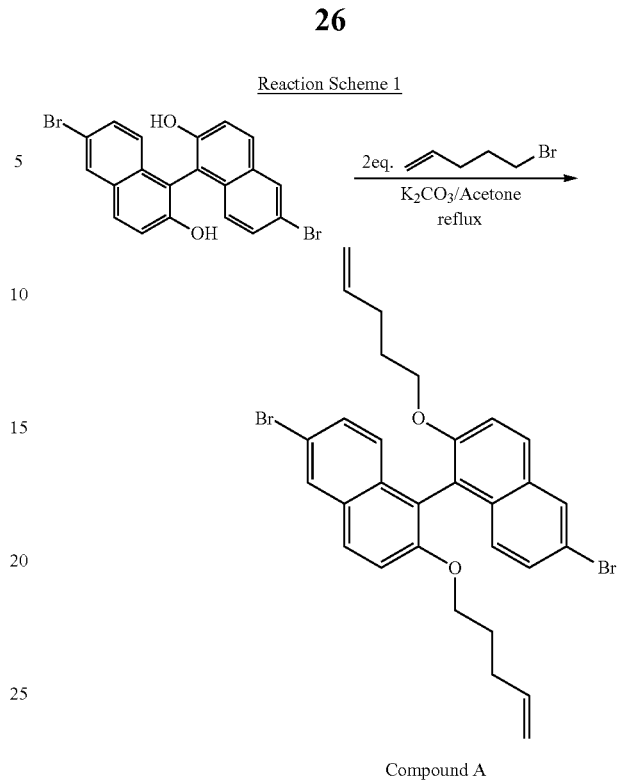

Reaction Scheme 1

Compound A

In the reaction, 13.1 ml of anhydrous acetone and 2.0 g (4.5 mmol) of 6,6'-dibromo-1,1'-bi-2-naphthol are added to a 50 ml one neck Schlenk flask in a nitrogen atmosphere, with stirring. 1.87 g (3 eq) of $K_2CO_3$ and 1.61 ml (18.0 mmol) of 5-bromo-1-pentene are added thereto, and the flask is maintained at 70° C. for 22 hours and slowly cooled. After the reaction, the reaction mixture is filtered to remove $K_2CO_3$ and extracted three times with distilled water and $CH_2Cl_2$. Moisture is removed from the reaction mixture using anhydrous magnesium sulfate, and the resultant treated under a reduced pressure to obtain a solid. The solid product is dissolved in $CH_2Cl_2$ and recrystallized using MeOH to obtain 1.3 g of yellowish solid product (2.24 mmol). Yield: 50%.

Synthesis Example 2

Synthesis of Compound B

Compound B is synthesized according to Reaction Scheme 2 below:

Reaction Scheme 2

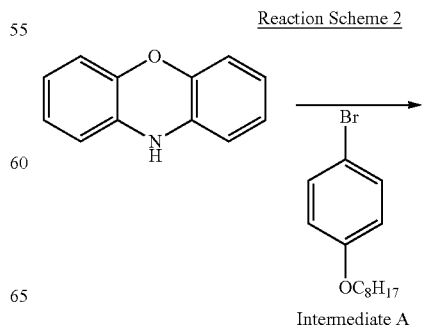

Intermediate A

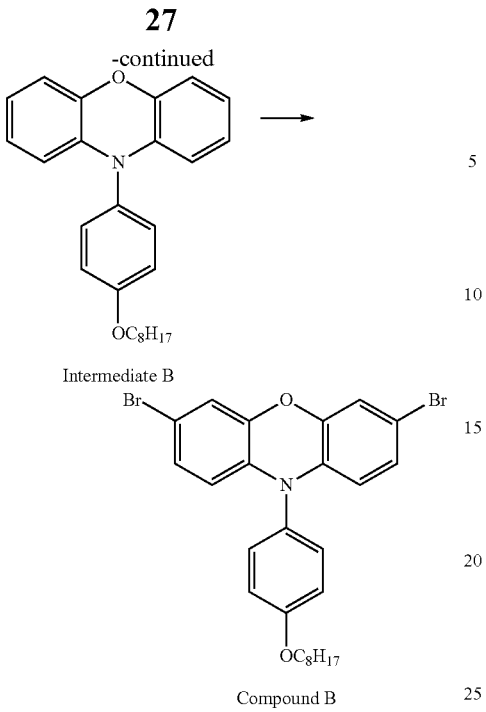

Intermediate B

Compound B

Synthesis of Intermediate A 50 g (0.29 mol) of 4-bromophenol is dissolved in 500 ml of acetone, and 48.4 g (0.35 mol) of $K_2CO_3$ is added thereto. Then, 73.3 g (0.38 mol) of 1-bromooctane is added thereto, and the mixture refluxed for 24 hours.

After the reaction is terminated, the resultant s extracted using a solution including water and $CHCl_3$ (water:$CHCl_3$=2:1, v/v) to remove $K_2CO_3$. An organic layer was dried using $MgSO_4$ and concentrated, and then subjected to silica gel column chromatography using hexane as the eluent. The combined fractions obtained therefrom was are distilled under reduced pressure to remove unreacted 1-bromooctane, and to obtain 80 g of Intermediate A (yield: 96%). The structure of Intermediate A was identified using $^1$H-NMR.

Synthesis of Intermediate B 18 g (64 mmol) of Intermediate A, 10 g (54 mmol) of phenoxazine, 7.4 g (77 mmol) of sodium tert-butoxide, 0.61 g (1.1 mmol) of tris(dibenzylidine acetone) dipalladium(0) (Pd (dba)$_2$), and 0.22 g (1.1 mmol) of tri(tert-butyl)phosphine are dissolved in 250 ml of xylene, and the mixture maintained at 80° C. for 12 hours.

After the reaction is terminated, the mixture was cooled to room temperature, and 200 ml of distilled water was added thereto for quenching. Then, the resultant was subjected to extraction using a solution including xylene and water (xylene:water=1:1, v/v). A collected organic layer was dried using $MgSO_4$ and concentrated, and then subjected to silica gel column chromatography using a solution including toluene and hexane (toluene:hexane=1:2, v/v) as eluant. The combined fractions are concentrated and dried to obtain 18.5 g of Intermediate B (yield: 88%). The structure of Intermediate B was identified using $^1$H-NMR.

Synthesis of Compound B 5 g (13 mmol) of Intermediate B is dissolved in 150 mL of $CHCl_3$, and 2.1 equivalents of bromine based on Intermediate B is gradually added thereto while the solution was maintained at 0° C. When the starting material was not observed based on the results of thin layer chromatography ("TLC"), the adding of bromine to the mixture was stopped, and the mixture was stirred for 10 minutes and the reaction was terminated.

A small amount of acetone was added to the reaction mixture for quenching bromine, and the resultant was subjected to extraction using a solution including water and $CHCl_3$ (water:$CHCl_3$=2:1, v/v). A collected organic layer is dried using $MgSO_4$ and concentrated, and then re-precipitated in MeOH to obtain 6 g of Compound B (yield: 85%). The structure of Compound B was identified using $^1$H-NMR.

$^1$H-NMR (300 MHz, $CDCl_3$): δ 0.91 (m, 6H), δ1.45 (m, 8H), δ1.82 (m, 1H), δ3.89 (d, 2H), δ5.82 (d, 2H), δ6.5~7.5 (m, 8H)

Synthesis Example 3

Synthesis of Compound C

Compound C was synthesized through Reaction Scheme 3 below:

Reaction Scheme 3

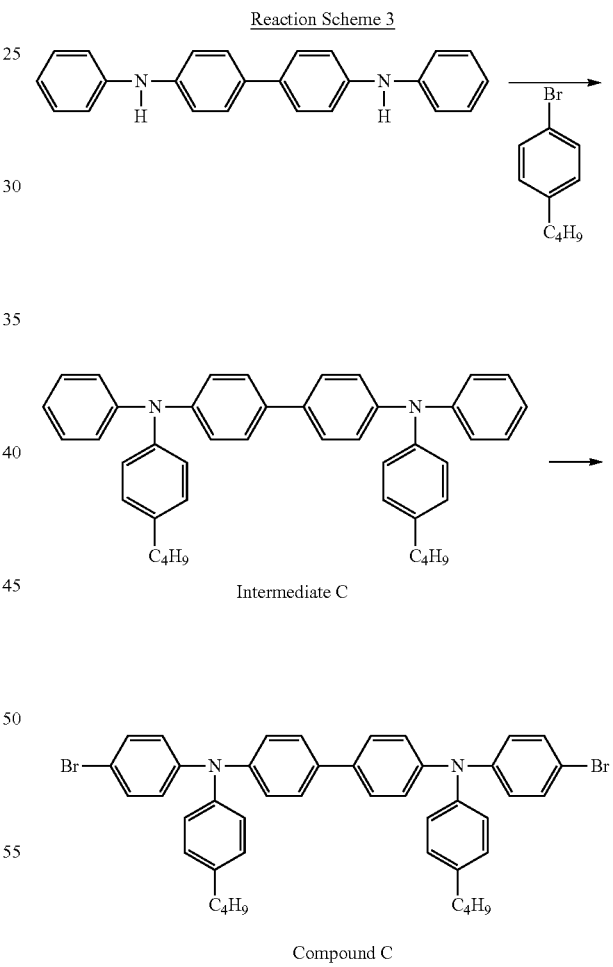

Intermediate C

Compound C

Compound C was synthesized in the same manner as in the synthesis of Compound B according to Synthesis Example 2, except that Intermediate C was synthesized using 1-bromo-4-butylbenzene instead of Intermediate A and N,N'-diphenylbenzidine instead of phenoxazine and brominated Intermediate C.

Synthesis Example 4

Synthesis of Polymer 1

Polymer 1 was synthesized through Reaction Scheme 4 below:

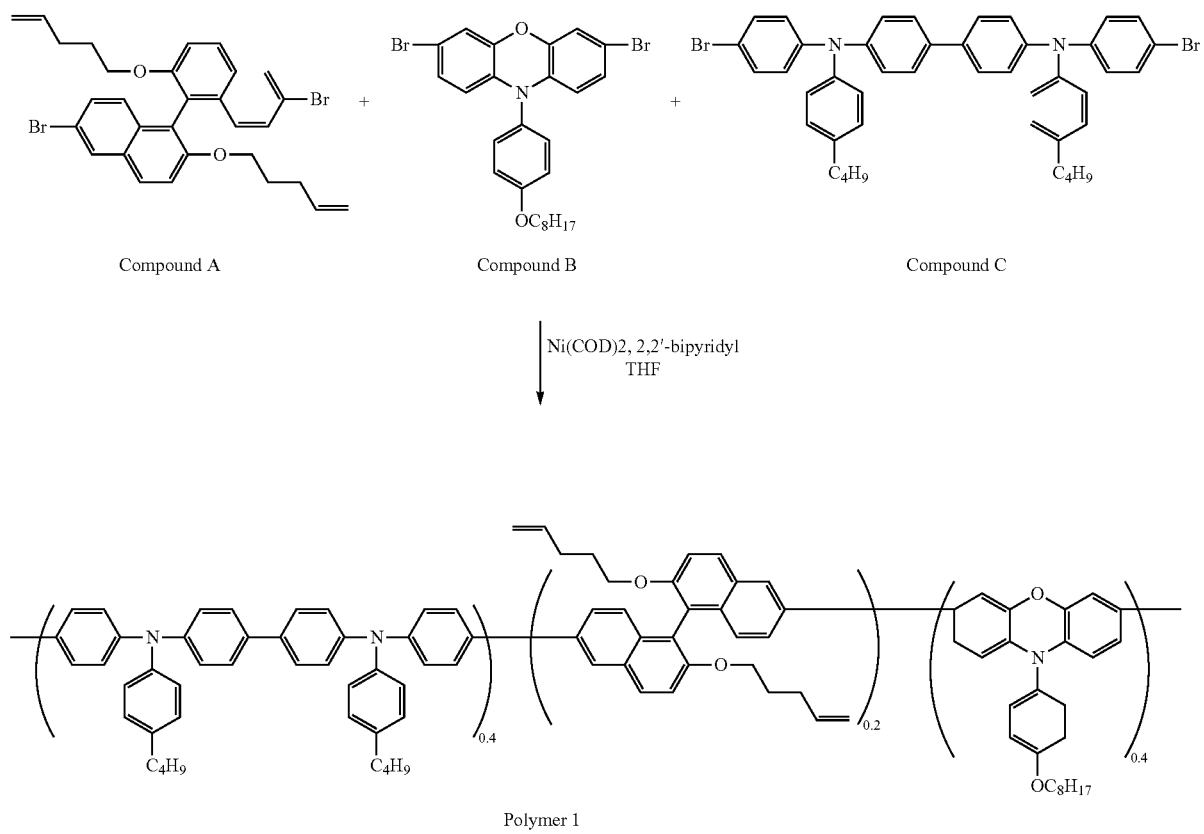

A mixture including 0.045 g ($7.75 \times 10^{-5}$ mmol) of Compound A, 0.084 g ($1.54 \times 10^{-4}$ mmol) of Compound B, 0.117 g ($1.54 \times 10^{-4}$ mmol) of Compound C, 330 mg of Ni(COD)$_2$ (COD=1,5-cyclooctadiene), 187 mg of 2,2'-bipyridyl, and 20 ml of tetrahydrofuran ("THF") is stirred at 60° C. for 24 hours. After the reaction is terminated, the reaction mixture is precipitated in methanol to obtain precipitate. The precipitate is filtered and dried to obtain solid. The solid is dissolved in toluene and purified using silica gel/alumina column chromatography. The resultant was precipitated in methanol, filtered, and dried to obtain 110 mg of Polymer 1 (yield: 65%). Gel Permeation Chromatography (GPC) analysis of Polymer 1 provided a of Polymer 1 based on polystyrene standards is 38,000 and PDI of Polymer 1 was 2.35.

Synthesis Example 5

Synthesis of Compound D

Compound D was synthesized through Reaction Scheme 5 below.

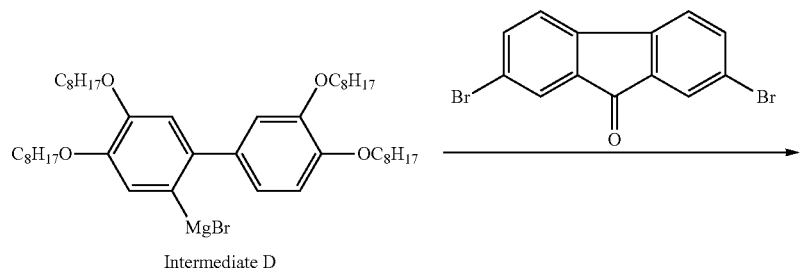

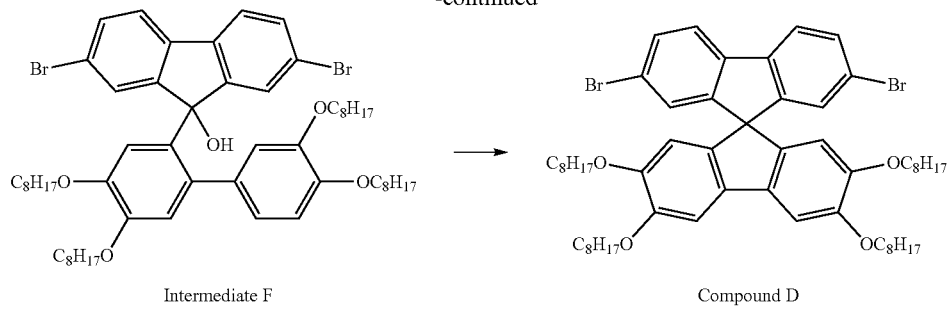

Intermediate F → Compound D

Synthesis of Intermediate F

A mixture of 50 ml of ether and 8.45 g (11 mmol) of Intermediate D is added to a mixture of 3.36 g (10 mmol) of 2,7-dibromo-9-fluorenone and 50 ml of ether, and the mixture was refluxed overnight. The mixture is cooled, and yellow solid powder is filtered and washed three times with ether. Then, the resultant is added to ammonium chloride, and the mixture is stirred for 10 hours. The precipitate is filtered and washed three times with water. The product is recrystallized using ethanol to obtain yellow solid Intermediate F (yield: 83%).

Synthesis of Compound D 5.0 g (5 mmol) of Intermediate F is added to 15 ml of $CH_3COOH$, and the mixture is refluxed mildly. Then, 0.5 ml of hydrochloric acid is added to the reaction solution, and the resultant is refluxed for 1 hour. After the reaction is terminated, the mixture is cooled to room temperature. Solid powder was collected by filtration and washed three times with water. The product is recrystallized using ethanol to obtain 1.42 g (1.44 mmol) of Compound D as a white powder (yield: 29%). The structure of Compound D was identified using $^1$H-NMR.

$^1$H-NMR (300 MHz, $CDCl_3$): δ7.60 (d, 2H), δ7.43 (dd, 2H), δ7.16 (d, 2H), δ6.79 (s, 2H), δ6.20 (s, 2H), δ4.18 (m, 4H), δ3.75 (m, 4H), δ1.94 (m, 8H), δ1.72 (m, 8H), δ1.30 (m, 32H), δ0.96 (m, 12H).

Synthesis Example 6

Synthesis of Polymer 2

A Schlenk flask is evacuated and nitrogen-refluxed several times to completely remove moisture. 880 mg (3.2 mmol) of $Ni(COD)_2$ and 500 mg (3.2 mmol) of bipyridal are added to the flask under inert atmosphere in a glove box, and then the flask is evacuated and nitrogen-flushed several times. Then, 10 ml of anhydrous dimethylformamide ("DMF"), 346 mg (3.2 mmol) of COD, and 10 ml of anhydrous toluene added to the reaction mixture in a nitrogen atmosphere. The reaction mixture is stirred at 80° C. for 30 minutes, and then 87 mg (0.16 mmol) of Compound B and 1.42 g (1.44 mmol) of Compound D which are diluted in 10 ml of toluene are added thereto. Then, 10 ml of toluene is added to thereto while washing the wall of the flask, and then the mixture is stirred at 80° C. for 4 days. After 4 days, 1 ml of bromopentafluorobenzene is added thereto, and then the mixture was stirred at 80° C. for one day.

After the reaction was completed, the reaction mixture is cooled to 60° C., and a solution including conc. HCl (37% w/w aqueous solution), acetone, and methanol (HCl:acetone:methanol=1:1:2, v/v) is added thereto to form precipitate. The precipitate was dissolved in chloroform, and precipitated in methanol. The resultant is continuously extracted using a Soxhlet extractor to obtain 620 mg of Polymer 2 (yield: 80%). GPC analysis of Polymer 2 showed a weight average molecular weight (Mw) of Polymer 2 based on polystyrene standards of 198,000 and PDI of Polymer 2 of 2.07.

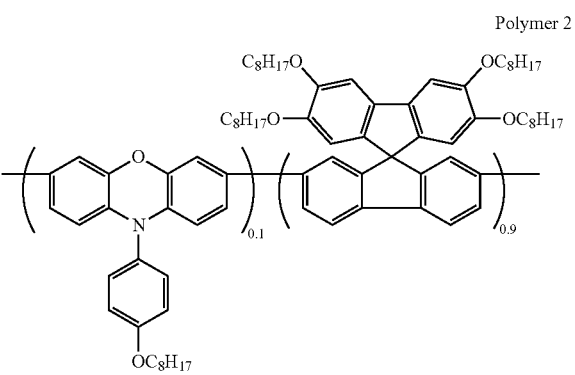

Polymer 2

Evaluation Example 1

Evaluation of Light Emitting Properties of Polymer 1 (in Solution)

Light emitting properties of Polymer 1 are evaluated using photoluminescence ("PL") spectra of Polymer 1. Polymer 1 is diluted in toluene to a concentration of 10 mM, and the photoluminescence (PL) spectrum thereof measured using an ISC PC1 spectrofluorometer equipped with a Xenon lamp.

Figure 2:
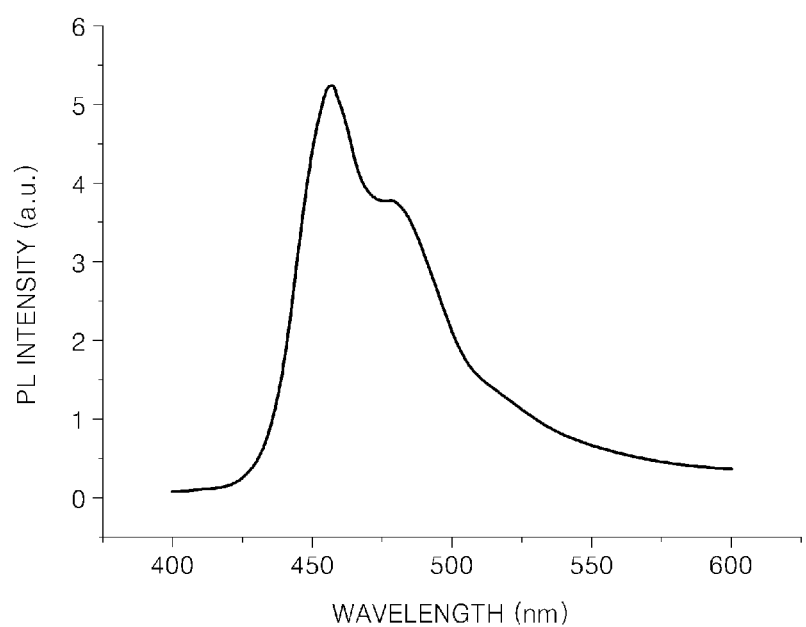
FIG. 2 is a graph illustrating photoluminescence characteristics of Polymer 1 in a thin film.

Referring to FIG. 2, the maximum light emitting wavelength in the PL spectrum of a thin film formed of Polymer 1 was about 450 nm.

Example 1

A transparent electrode substrate coated with indium-tin oxide (ITO) is cleaned. Then, the ITO layer is patterned using a photosensitive resin and an etchant to obtain a desired pattern and then cleaned. An HIL-forming composition including PEDOT (BATRON™ P 4083, manufactured by Bayer) is coated on the ITO layer to a thickness of about 50 nm, and then baked at 200° C. for about 0.5 hours to form a HIL. A HTL-forming composition including 99.2 parts by weight of chlorobenzene and 0.8 parts by weight of Polymer 1 is spin-coated on the HIL and heat-treated at 180° C. for 30 minutes to form a HTL including the cross-linked material of Polymer 1. An EML-forming composition including 99.0 parts by weight of toluene and 1 part by weight of Polymer 2 is spin-coated on the HTL and baked at 180° C. for 30 minutes to form an EML including Polymer 2. The thicknesses of the HTL and the EML are respectively 20 nm and 80 nm by controlling the concentration of the compositions and the spin coating rate. $BaF_2$ is vacuum-deposited on the EML at a pressure of $4 \times 10^{-6}$ torr to form an EIL having a thickness of 5 nm. Then, Ca and Al are sequentially deposited on the EIL with a thickness of 2.7 nm and 150 nm, respectively to form a second electrode, thereby manufacturing an organic light emitting device. During the vacuum deposition, the thickness of the layer and the growth rate of the layer were controlled using a crystal sensor.

Comparative Example 1

An organic light emitting device is manufactured in the same manner as in Example 1, except that the HTL-forming composition including Polymer A (TFB) below, instead of Polymer 1, is spin-coated on the HIL and heat-treated at 180° C. for 30 minutes to form a HTL including Polymer A.

Polymer A

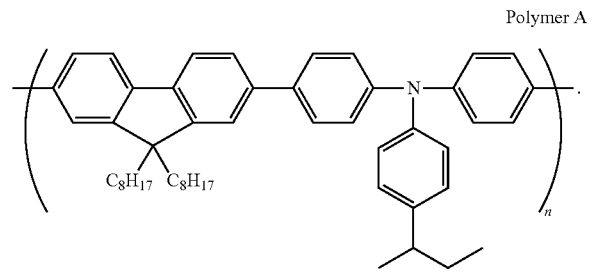

Evaluation Example 2

Evaluation of Organic Light Emitting Device

Figure 3:
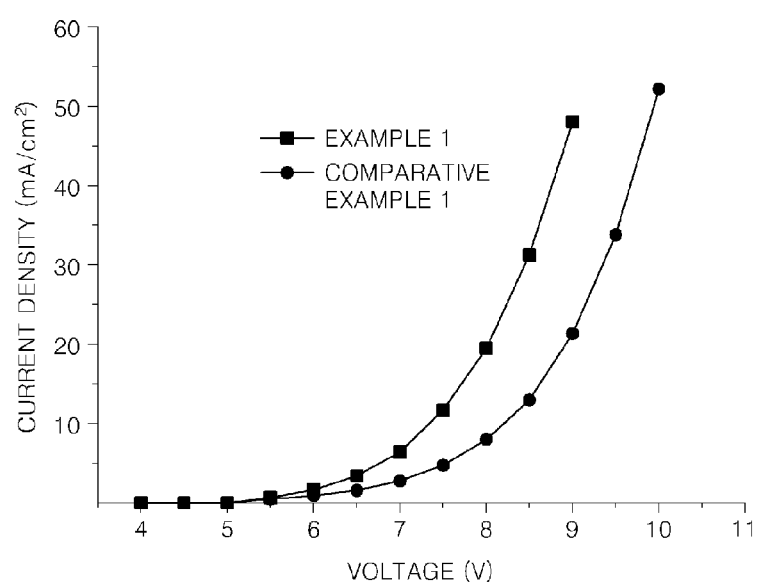
FIG. 3 is a graph illustrating voltage-current density of organic light emitting devices prepared according to Example 1 and Comparative Example 1.
Figure 4:
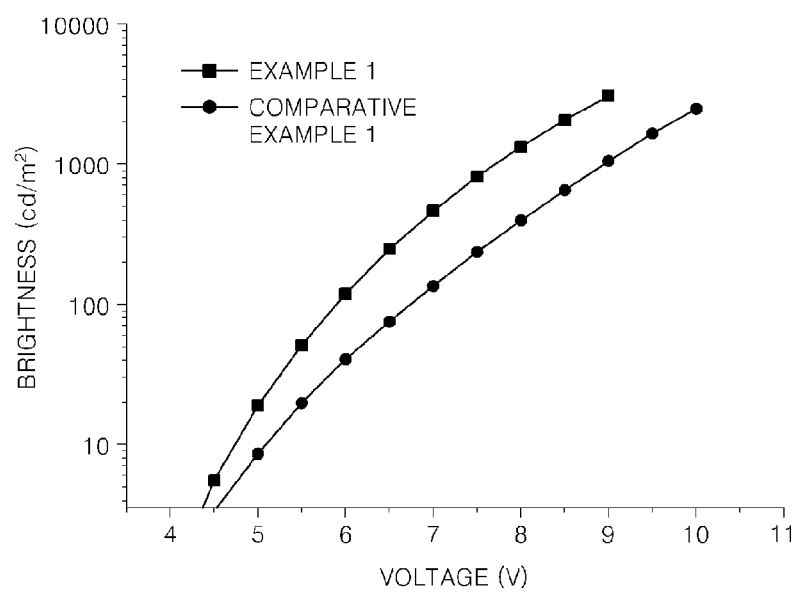
FIG. 4 is a graph illustrating voltage-brightness of organic light emitting devices prepared according to Example 1 and Comparative Example 1.
Figure 5:
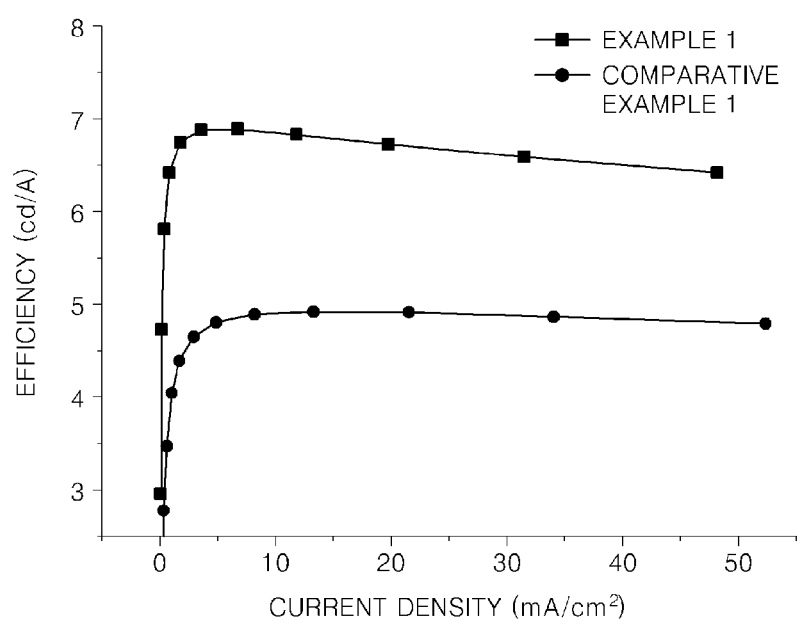
FIG. 5 is a graph illustrating current density-efficiency of organic light emitting devices prepared according to Example 1 and Comparative Example 1.
Figure 6:
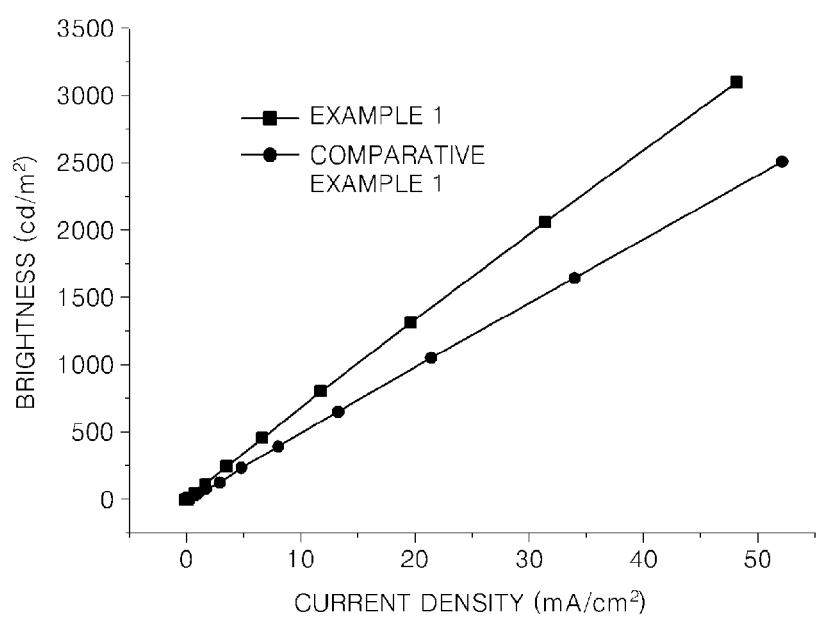
FIG. 6 is a graph illustrating current density-brightness of organic light emitting devices prepared according to Example 1 and Comparative Example 1.

Current density, brightness, and efficiency of the organic light emitting devices manufactured according to Example 1 and Comparative Example 1 are evaluated using a PR650Spectroscan Source Measurement Unit (Photo-Reaserch). FIGS. 3 to 6 are graphs illustrating voltage-current density (FIG. 3), voltage-brightness (FIG. 4), current density-efficiency (FIG. 5), and current density-brightness (FIG. 6) of organic light emitting devices prepared according to Example 1 and Comparative Example 1. Referring to FIGS. 3 and 6, it is seen that the organic light emitting device manufactured according to Example 1 had higher current density, brightness, and efficiency than the organic light emitting device manufactured according to Comparative Example 1.

As described above, the cross-linkable polymer of Formula 1 according to the one or more of the above embodiments may be efficiently cross-linked by cross-linkable moiety contained in the cross-linkable polymer, and the organic light emitting device including the cross-linked material of the cross-linkable polymer may have high efficiency, high current density, and high brightness.

It should be understood that the exemplary embodiments described therein should be considered in a descriptive sense only and not for purposes of limitation. Descriptions of features or aspects within each embodiment should typically be considered as available for other similar features or aspects in other embodiments.

What is claimed is:
1. A cross-linkable polymer comprises Formula 1 below:

Formula 1

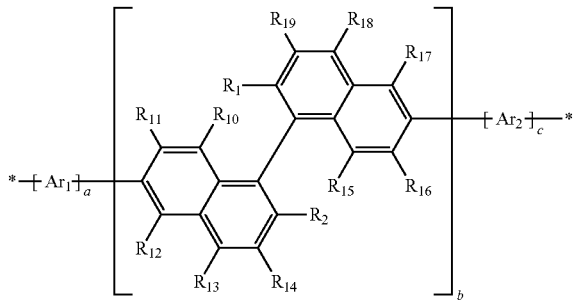

wherein $R_1$, $R_2$, and $R_{10}$ to $R_{19}$ are each independently selected from the group consisting of a cross-linkable group, a hydrogen atom, a halogen atom, a hydroxyl group, an amino group, a cyano group, carboxylic acid, a substituted or unsubstituted $C_1$-$C_{30}$ alkyl group, a substituted or unsubstituted $C_1$-$C_{30}$ alkoxy group, a substituted or unsubstituted $C_6$-$C_{30}$ aryl group, a substituted or unsubstituted $C_6$-$C_{30}$ aryloxy group, a substituted or unsubstituted $C_3$-$C_{30}$ heteroaryl group, —N($Q_1$)($Q_2$), —Si($Q_3$)($Q_4$)($Q_5$), and any combination thereof, wherein at least one of $R_1$ and $R_2$ is a cross-linkable group;

$Ar_1$ is a bivalent group -$(L_1)_n$-, wherein $L_1$ is selected from the group consisting of a linking group —N($Q_6$)—, a substituted or unsubstituted $C_6$-$C_{30}$ arylene group, and a substituted or unsubstituted $C_3$-$C_{30}$ heteroarylene group, n is an integer of 1 to 20, and each individual $L_1$ of -$(L_1)_n$- is the same or different;

$Q_1$ to $Q_6$ are each independently selected from the group consisting of a hydrogen atom, a halogen atom, a hydroxyl group, an amino group, a cyano group, a carboxylic acid group, a substituted or unsubstituted $C_1$-$C_{30}$ alkyl group, a substituted or unsubstituted $C_1$-$C_{30}$ alkoxy group, a substituted or unsubstituted $C_6$-$C_{30}$ aryl group, a substituted or unsubstituted $C_6$-$C_{30}$ aryloxy group, a substituted or unsubstituted $C_3$-$C_{30}$ heteroaryl group, and any combination thereof;

$Ar_2$ is selected from the group consisting of a substituted or unsubstituted pyrrolylene group, a substituted or unsubstituted pyrazolylene group, a substituted or unsubstituted imidazolylene group, a substituted or unsubstituted imidazolinylene group, a substituted or unsubstituted imidazopyridinylene group, a substituted or unsubstituted imidazopyrimidinylene group, a substituted or unsubstituted pyridinylene group, a substituted or unsubstituted pyrazinylene group, a substituted or unsubstituted pyrimidinylene group, a substituted or unsubstituted indolylene group, a substituted or unsubstituted purinylene group, a substituted or unsubstituted quinolinylene group, a substituted or unsubstituted phthalazinylene group, a substituted or unsubstituted indolizinylene group, a substituted or unsubstituted naphthyridinylene group, a substituted or unsubstituted quinazolinylene group, a substituted or unsubstituted cinnolinylene group, a substituted or unsubstituted indazolylene group, a substituted or unsubstituted carbazolylene group, a substituted or unsubstituted phenazinylene group, a substituted or unsubstituted phenanthridinylene group, a substituted or unsubstituted pyranylene group, a substituted or unsubstituted chromenylene group, a substituted or unsubstituted benzofuranylene group, a substituted or unsubstituted thiophenylene group, a substituted or unsubstituted benzothiophenylene group, a substituted or unsubstituted isothiazolylene group, a substituted or unsubstituted benzoimidazolylene group, a substituted or unsubstituted isoxazolylene group, a group of Formula 5A, a group of Formula 5B, a group of Formula 5C, a group of Formula 5D, and any combination thereof:

Formula 5A
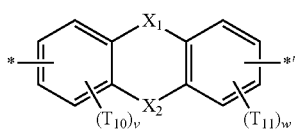

Formula 5B
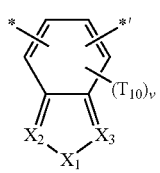

Formula 5C
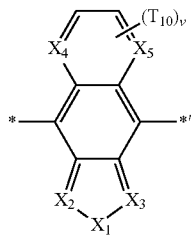

Formula 5D
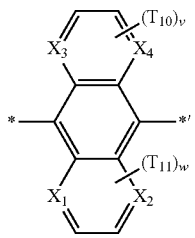

wherein $X_1$ to $X_5$ are each independently selected from the group consisting of

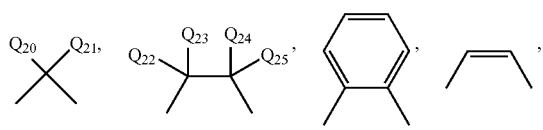

—O—, —S—, —N═, —N($Q_{26}$)—, —C($Q_{27}$)═, and —C($Q_{28}$)($Q_{29}$)—, and any combination thereof, wherein $Q_{20}$ to $Q_{29}$, $T_{10}$ and $T_{11}$ are each independently selected from the group consisting of a hydrogen atom, a substituted or unsubstituted $C_1$-$C_{30}$ alkyl group, a substituted or unsubstituted $C_1$-$C_{30}$ alkoxy group, a substituted or unsubstituted $C_6$-$C_{30}$ aryl group, a substituted or unsubstituted $C_5$-$C_{30}$ heteroaryl group, and any combination thereof, v and w are each independently an integer of from 1 to 3 and * and *' are each independently a connection point within the polymer;

a, b, and c are each independently a real number wherein 0≤a≤0.99, 0<b≤0.99, and 0<c≤0.99, and a+b+c=1; and

* is a connection point within the polymer, wherein, in Formula 5A, at least one of $X_1$ and $X_2$ is selected from —O—, —S—, —N═, and —N($Q_{26}$)—;

in Formula 5B, at least one of $X_1$ to $X_3$ is selected from —O—, —S—, —N═, and —N($Q_{26}$)—;

in Formula 5C at least one of $X_1$ to $X_5$ is selected from —O—, —S—, —N═, and —N($Q_{26}$)—; and in Formula 5D, at least one of $X_1$ to $X_4$ is selected from —O—, —S—, —N═, and —N($Q_{26}$)—.

2. The cross-linkable polymer of claim 1, wherein the cross-linkable group is selected from the group consisting of a $C_1$-$C_{30}$ alkyl group including at least one cross-linkable moiety, a $C_1$-$C_{30}$ alkoxy group including at least one cross-linkable moiety, a $C_6$-$C_{30}$ aryl group including at least one cross-linkable moiety, a $C_6$-$C_{30}$ aryloxy group including at least one cross-linkable moiety, a $C_3$-$C_{30}$ heteroaryl group including at least one cross-linkable moiety, and any combination thereof.

3. The cross-linkable polymer of claim 2, wherein the cross-linkable moiety is one selected from the group consisting of Formulae 2A, 2B, 2C, and 2D below:

Formula 2A
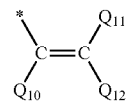

Formula 2B

Formula 2C
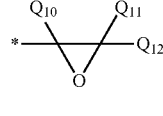

Formula 2D
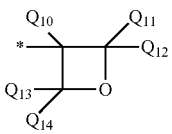

wherein $Q_{10}$ to $Q_{14}$ are each independently selected from the group consisting of a hydrogen atom, a halogen atom, a hydroxyl group, an amino group, a cyano group, a carboxylic acid group, a substituted or unsubstituted $C_1$-$C_{30}$ alkyl group, a substituted or unsubstituted $C_1$-$C_{30}$ alkoxy group, a substituted or unsubstituted $C_6$-$C_{30}$ aryl group, a substituted or unsubstituted $C_6$-$C_{30}$ aryloxy group, a substituted or unsubstituted $C_3$-$C_{30}$ heteroaryl group, and any combination thereof, and * is a binding site with a backbone of the cross-linkable group.

4. The cross-linkable polymer of claim 3, wherein $Q_{10}$ to $Q_{14}$ are each independently selected from the group consisting of a hydrogen atom, a halogen atom, a hydroxyl group, an amino group, a cyano group, a carboxylic acid group, a $C_1$-$C_{10}$ alkyl group, a $C_1$-$C_{10}$ alkoxy group, a $C_6$-$C_{14}$ aryl group, a $C_3$-$C_{14}$ heteroaryl group, any combination thereof.

5. The cross-linkable polymer of claim 3, wherein the cross-linkable moiety is Formula 2A-1 or 2B-1 below:

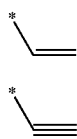

Formula 2A-1

Formula 2B-1 wherein * is a binding site with a backbone of the cross-linkable group.

6. The cross-linkable polymer of claim 1, wherein the cross-linkable group is one selected from the group consisting of Formulae 3A to 3H below:

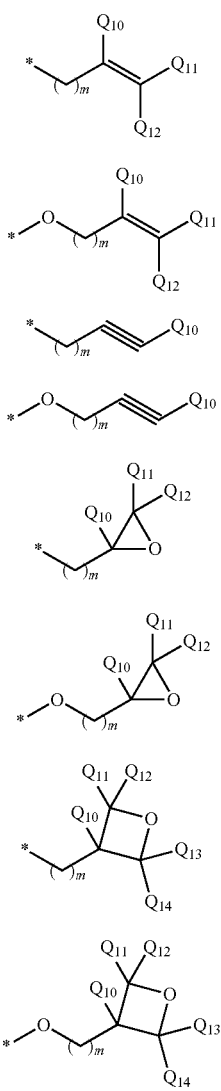

Formula 3A

Formula 3B

Formula 3C

Formula 3D

Formula 3E

Formula 3F

Formula 3G

Formula 3H wherein $Q_{10}$ to $Q_{14}$ are each independently selected from the group consisting of a hydrogen atom, a halogen atom, a hydroxyl group, an amino group, a cyano group, a carboxylic acid group, a substituted or unsubstituted $C_1$-$C_{30}$ alkyl group, a substituted or unsubstituted $C_1$-$C_{30}$ alkoxy group, a substituted or unsubstituted $C_6$-$C_{30}$ aryl group, a substituted or unsubstituted $C_6$-$C_{30}$ aryloxy group, a substituted or unsubstituted $C_3$-$C_{30}$ heteroaryl group, and any combination thereof, m is an integer of 1 to 30, and * is a binding site with a naphthyl group of Formula 1.

7. The cross-linkable polymer of claim 1, wherein $L_1$ is selected from the group consisting of a linking group —N($Q_6$)—, a substituted or unsubstituted phenylene group, a substituted or unsubstituted pentalenylene group, a substituted or unsubstituted indenylene group, a substituted or unsubstituted naphthylene group, a substituted or unsubstituted azulenylene group, a substituted or unsubstituted heptalenylene group, a substituted or unsubstituted indacenylene group, a substituted or unsubstituted acenaphthylene group, a substituted or unsubstituted fluorenylene group, a substituted or unsubstituted phenalenylene group, a substituted or unsubstituted phenanthrenylene group, a substituted or unsubstituted anthracenylene group, a substituted or unsubstituted fluoranthenylene group, a substituted or unsubstituted triphenylenylene group, a substituted or unsubstituted pyrenylenylene group, a substituted or unsubstituted chrysenylene group, a substituted or unsubstituted naphthacenylene group, a substituted or unsubstituted picenylene group, a substituted or unsubstituted perylenylene group, a substituted or unsubstituted pentaphenylene group, a substituted or unsubstituted hexacenylene group, a substituted or unsubstituted pyrrolylene group, a substituted or unsubstituted pyrazolylene group, a substituted or unsubstituted imidazolylene group, a substituted or unsubstituted imidazolinylene group, a substituted or unsubstituted imidazopyridinylene group, a substituted or unsubstituted imidazopyrimidinylene group, a substituted or unsubstituted pyridinylene group, a substituted or unsubstituted pyrazinylene group, a substituted or unsubstituted pyrimidinylene group, a substituted or unsubstituted indolylene group, a substituted or unsubstituted purinylene group, a substituted or unsubstituted quinolinylene group, a substituted or unsubstituted phthalazinylene group, a substituted or unsubstituted indolizinylene group, a substituted or unsubstituted naphthyridinylene group, a substituted or unsubstituted quinazolinylene group, a substituted or unsubstituted cinnolinylene group, a substituted or unsubstituted indazolylene group, a substituted or unsubstituted carbazolylene group, a substituted or unsubstituted phenazinylene group, a substituted or unsubstituted phenanthridinylene group, a substituted or unsubstituted pyranylene group, a substituted or unsubstituted chromenylene group, a substituted or unsubstituted benzofuranylene group, a substituted or unsubstituted thiophenylene group, a substituted or unsubstituted benzothiophenylene group, a substituted or unsubstituted isothiazolylene group, a substituted or unsubstituted benzoimidazolylene group, a substituted or unsubstituted isoxazolylene group, and any combination thereof, and $Q_6$ is selected from the group consisting of a hydrogen atom, a halogen atom, a hydroxyl group, an amino group, a cyano group, a carboxylic acid group, a substituted or unsubstituted $C_1$-$C_{10}$ alkyl group, a substituted or unsubstituted $C_1$-$C_{10}$ alkoxy group, a substituted or unsubstituted $C_6$-$C_{14}$ aryl group, a substituted or unsubstituted $C_3$-$C_{14}$ heteroaryl group, and any combination thereof.

8. The cross-linkable polymer of claim 1, wherein $Ar_1$ is one selected from the group consisting of Formulae 4A to 4C below:

Formula 4A

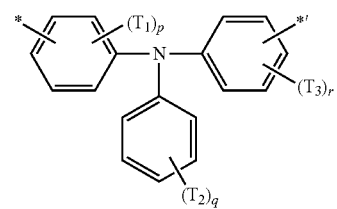

Formula 4B

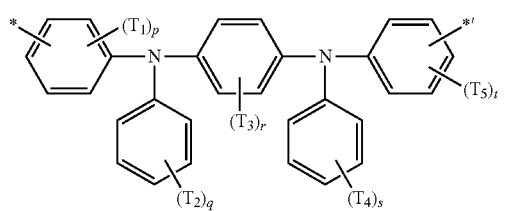

Formula 4C

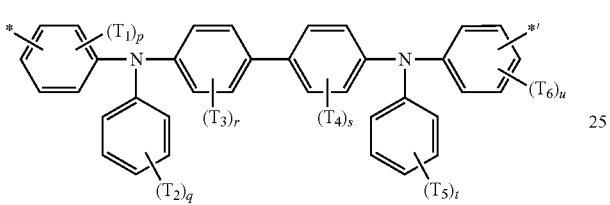

wherein $T_1$ to $T_6$ are each independently selected from the group consisting of a hydrogen atom, a halogen atom, a cyano group, an amino group, a hydroxyl group, a $C_1$-$C_{10}$ alkyl group, a $C_1$-$C_{10}$ alkoxy group, a $C_6$-$C_{14}$ aryl group, and any combination thereof, wherein p, q, r, s, t, and u are each independently an integer of from 1 to 5; and * and *' are each independently a connection point within the polymer.

9. The cross-linkable polymer of claim 1, wherein $Ar_2$ is one selected from the group consisting of Formulae 6A to 6H below:

Formula 6A

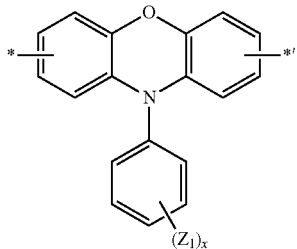

Formula 6B

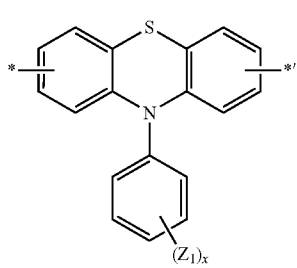

Formula 6C

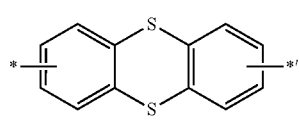

Formula 6D

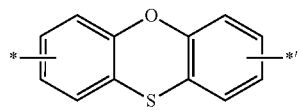

Formula 6E

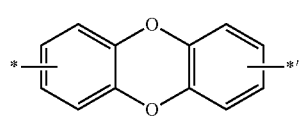

Formula 6F

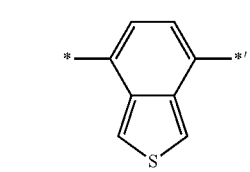

Formula 6G

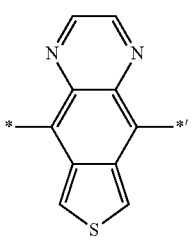

Formula 6H

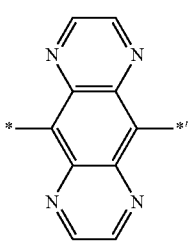

wherein $Z_1$ is selected from the group consisting of a hydrogen atom, a halogen atom, a hydroxyl group, a cyano group, an amino group, a substituted or unsubstituted $C_1$-$C_{30}$ alkyl group, a substituted or unsubstituted $C_1$-$C_{30}$ alkoxy group, a substituted or unsubstituted $C_6$-$C_{30}$ aryl group, a substituted or unsubstituted $C_3$-$C_{30}$ heteroaryl group, and any combination thereof, x is an integer of from 1 to 5; and * and *' are each independently a connection point within the polymer.

10. The cross-linkable polymer of claim 1, wherein the cross-linkable polymer comprises Formula 1A below:

Formula 1A

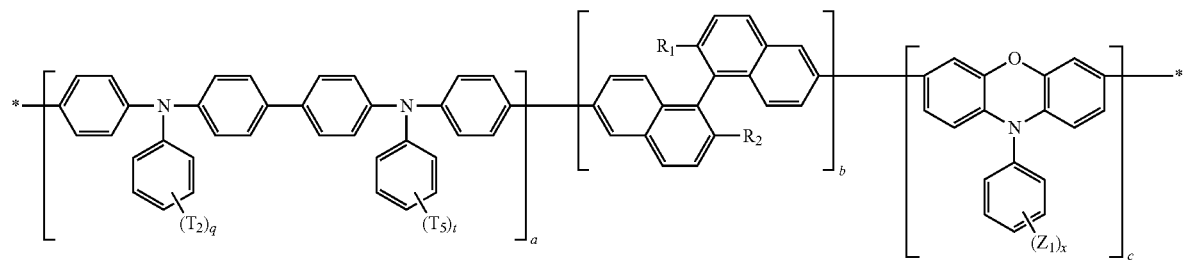

wherein $T_2$, $T_5$, and $Z_1$ are each independently selected from the group consisting of a hydrogen atom, a halogen atom, a cyano group, an amino group, a hydroxyl group, a $C_1$-$C_{10}$ alkyl group, a $C_1$-$C_{10}$ alkoxy group, a $C_6$-$C_{14}$ aryl group, and any combination thereof;

q, t, and x are each independently an integer of from 1 to 5;

$R_1$ and $R_2$ are each independently a cross-linkable group selected from the group consisting of a $C_1$-$C_{30}$ alkyl group including at least one cross-linkable moiety, a $C_1$-$C_{30}$ alkoxy group including at least one cross-linkable moiety, a $C_6$-$C_{30}$ aryl group including at least one cross-linkable moiety, a $C_6$-$C_{30}$ aryloxy group including at least one cross-linkable moiety, a $C_3$-$C_{30}$ heteroaryl group including at least one cross-linkable moiety, and any combination thereof;

* is a connection point within the polymer; and the cross-linkable moiety is of one selected from the group consisting of Formulae 2A, 2B, 2C, and 2D below:

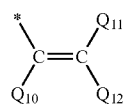

Formula 2A

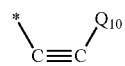

Formula 2B

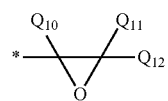

Formula 2C

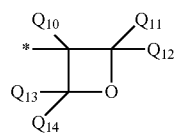

Formula 2D wherein $Q_{10}$ to $Q_{14}$ are each independently selected from the group consisting of a hydrogen atom, a halogen atom, a hydroxyl group, an amino group, a cyano group, a carboxylic acid group, a substituted or unsubstituted $C_1$-$C_{30}$ alkyl group, a substituted or unsubstituted $C_1$-$C_{30}$ alkoxy group, a substituted or unsubstituted $C_6$-$C_{30}$ aryl group, a substituted or unsubstituted $C_6$-$C_{30}$ aryloxy group, a substituted or unsubstituted $C_3$-$C_{30}$ heteroaryl group, and any combination thereof, wherein * is a binding site with a backbone of the cross-linkable group.

11. The cross-linkable polymer of claim 1, having a weight average molecular weight of from about 2,000 to about 1,000,000.

12. A cross-linked material of a cross-linkable polymer according to claim 1.

13. The cross-linked material of claim 12, wherein the cross-linked material comprises Formula 10 below:

Formula 10

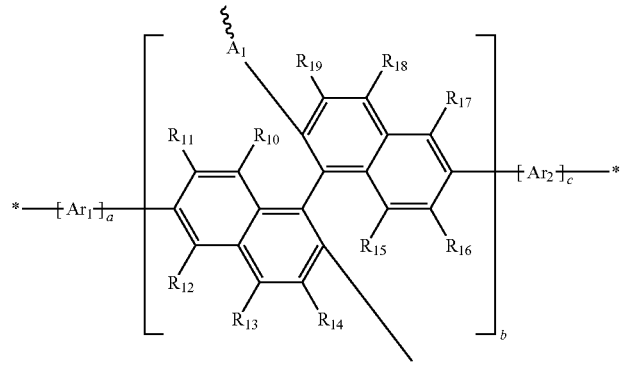

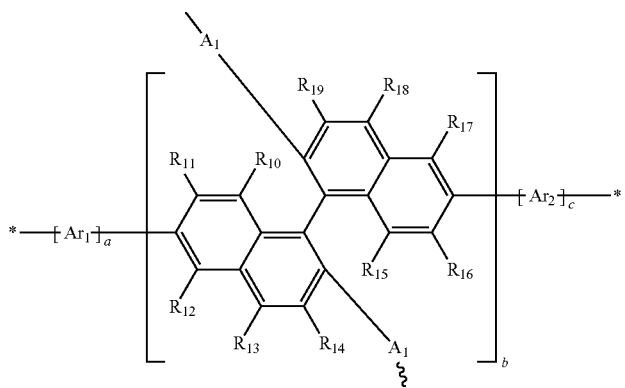

wherein $R_{10}$ to $R_{19}$ are each independently selected from the group consisting of a hydrogen atom, a halogen atom, a hydroxyl group, an amino group, a cyano group, a carboxylic acid group, a substituted or unsubstituted $C_1$-$C_{30}$ alkyl group, a substituted or unsubstituted $C_1$-$C_{30}$ alkoxy group, a substituted or unsubstituted $C_6$-$C_{30}$ aryl group, a substituted or unsubstituted $C_6$-$C_{30}$ aryloxy group, a substituted or unsubstituted $C_3$-$C_{30}$ heteroaryl group, —N($Q_1$)($Q_2$), —Si($Q_3$)($Q_4$)($Q_5$), and any combination thereof;

$Ar_1$ is a bivalent group -($L_1$)$_n$-, wherein $L_1$ is selected from the group consisting of a linking group —N($Q_6$)—, a substituted or unsubstituted $C_6$-$C_{30}$ arylene group, and a substituted or unsubstituted $C_3$-$C_{30}$ heteroarylene group, and n is an integer of from 1 to 20, and each individual $L_1$ are the same or different;

$Q_1$ to $Q_6$ are each independently selected from the group consisting of a hydrogen atom, a halogen atom, a hydroxyl group, an amino group, a cyano group, a carboxylic acid group, a substituted or unsubstituted $C_1$-$C_{30}$ alkyl group, a substituted or unsubstituted $C_1$-$C_{30}$ alkoxy group, a substituted or unsubstituted $C_6$-$C_{30}$ aryl group, a substituted or unsubstituted $C_6$-$C_{30}$ aryloxy group, a substituted or unsubstituted $C_3$-$C_{30}$ heteroaryl group, and any combination thereof;

$Ar_2$ is selected from the group consisting of a substituted or unsubstituted pyrrolylene group, a substituted or unsubstituted pyrazolylene group, a substituted or unsubstituted imidazolylene group, a substituted or unsubstituted imidazolinylene group, a substituted or unsubstituted imidazopyridinylene group, a substituted or unsubstituted imidazopyrimidinylene group, a substituted or unsubstituted pyridinylene group, a substituted or unsubstituted pyrazinylene group, a substituted or unsubstituted pyrimidinylene group, a substituted or unsubstituted indolylene group, a substituted or unsubstituted purinylene group, a substituted or unsubstituted quinolinylene group, a substituted or unsubstituted phthalazinylene group, a substituted or unsubstituted indolizinylene group, a substituted or unsubstituted naphthyridinylene group, a substituted or unsubstituted quinazolinylene group, a substituted or unsubstituted cinnolinylene group, a substituted or unsubstituted indazolylene group, a substituted or unsubstituted carbazolylene group, a substituted or unsubstituted phenazinylene group, a substituted or unsubstituted phenanthridinylene group, a substituted or unsubstituted pyranylene group, a substituted or unsubstituted chromenylene group, a substituted or unsubstituted benzofuranylene group, a substituted or unsubstituted thiophenylene group, a substituted or unsubstituted benzothiophenylene group, a substituted or unsubstituted isothiazolylene group, a substituted or unsubstituted benzoimidazolylene group, a substituted or unsubstituted isoxazolylene group, a group of Formula 5A, a group of Formula 5B, a group of Formula 5C, a group of Formula 5D, and any combination thereof:

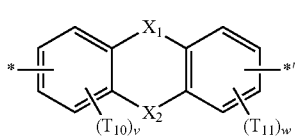

Formula 5A

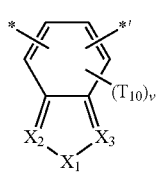

Formula 5B

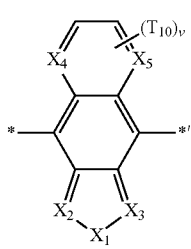

Formula 5C

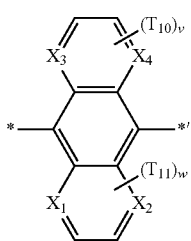

Formula 5D

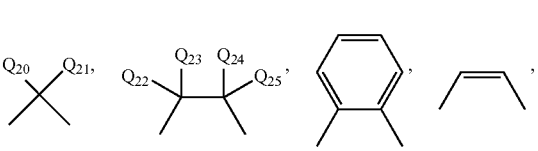

wherein $X_1$ to $X_5$ are each independently selected from the group consisting of —O—, —S—, —N═, —N($Q_{26}$)—, —C($Q_{27}$)═, and —C($Q_{28}$)($Q_{29}$)—, and any combination thereof, wherein $Q_{20}$ to $Q_{29}$, $T_{10}$ and $T_{11}$ are each independently selected from the group consisting of a hydrogen atom, a substituted or unsubstituted $C_1$-$C_{30}$ alkyl group, a substituted or unsubstituted $C_1$-$C_{30}$ alkoxy group, a substituted or unsubstituted $C_6$-$C_{30}$ aryl group, a substituted or unsubstituted $C_5$-$C_{30}$ heteroaryl group, and any combination thereof, v and w are each independently an integer of from 1 to 3 and * and *' are each independently a connection point within the polymer;

a, b, and c are each independently a real number wherein 0≤a≤0.99, 0<b≤0.99, and 0<c≤0.99, and a+b+c=1;

$A_1$ is a linking group -($L_2$)$_d$-, and $L_2$ is selected from the group consisting of —O—, a substituted or unsubstituted $C_2$-$C_{30}$ alkylene group, a substituted or unsubstituted $C_2$-$C_{30}$ alkenylene group, a substituted or unsubstituted $C_6$-$C_{30}$ arylene group, a substituted or unsubstituted $C_3$-$C_{30}$ heteroarylene group, and any combination thereof, wherein each individual $L_2$ of -($L_2$)$_d$- is the same or different, and d is an integer of from 1 to 60;

∿ is an adjacent, attached polymer chain; and

* is a connection point within the polymer, wherein, in Formula 5A, at least one of $X_1$ and $X_2$ is selected from —O—, —S—, —N═, and —N($Q_{26}$)—;

in Formula 5B, at least one of $X_1$ to $X_3$ is selected from —O—, —S—, —N═, and —N($Q_{26}$)—;

in Formula 5C at least one of $X_1$ to $X_5$ is selected from —O—, —S—, —N═, and —N($Q_{26}$)—; and in Formula 5D, at least one of $X_1$ to $X_4$ is selected from —O—, —S—, —N═, and —N($Q_{26}$)—.

14. An organic light emitting device comprising: a substrate; a first electrode; a second electrode; a first layer that is interposed between opposing surfaces of the first electrode and the second electrode, and comprises a cross-linked material comprising a cross-linkable polymer according to claim 1.

15. The organic light emitting device of claim 14, wherein the cross-linked material is a product obtained by cross-linking the cross-linkable moieties of at least one $R_1$ and $R_2$ of the cross-linkable polymer.

16. The organic light emitting device of claim 14, wherein the cross-linked material comprises Formula 10 below:

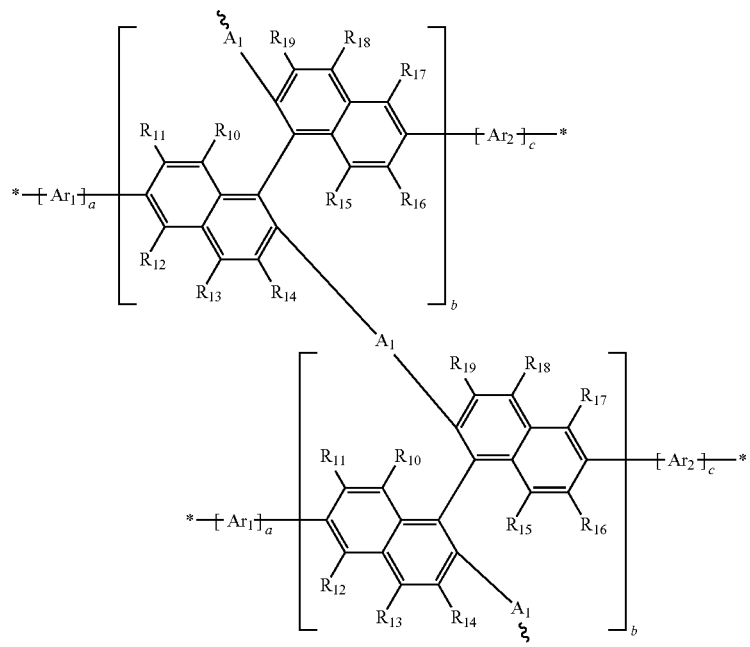

Formula 10 wherein $R_{10}$ to $R_{19}$ are each independently selected from the group consisting of a hydrogen atom, a halogen atom, a hydroxyl group, an amino group, a cyano group, a carboxylic acid group, a substituted or unsubstituted $C_1$-$C_{30}$ alkyl group, a substituted or unsubstituted $C_1$-$C_{30}$ alkoxy group, a substituted or unsubstituted $C_6$-$C_{30}$ aryl group, a substituted or unsubstituted $C_6$-$C_{30}$ aryloxy group, a substituted or unsubstituted $C_3$-$C_{30}$ heteroaryl group, —N($Q_1$)($Q_2$), —Si($Q_3$)($Q_4$)($Q_5$), and any combination thereof;

$Ar_1$ is a bivalent group -($L_1$)$_n$-, wherein $L_1$ is selected from the group consisting of a linking group —N($Q_6$)—, a substituted or unsubstituted $C_6$-$C_{30}$ arylene group, and a substituted or unsubstituted $C_3$-$C_{30}$ heteroarylene group, wherein n is an integer of from 1 to 20, and each individual $L_1$ is the same or different;

$Q_1$ to $Q_6$ are each independently selected from the group consisting of a hydrogen atom, a halogen atom, a hydroxyl group, an amino group, a cyano group, a carboxylic acid group, a substituted or unsubstituted $C_1$-$C_{30}$ alkyl group, a substituted or unsubstituted $C_1$-$C_{30}$ alkoxy group, a substituted or unsubstituted $C_6$-$C_{30}$ aryl group, a substituted or unsubstituted $C_6$-$C_{30}$ aryloxy group, a substituted or unsubstituted $C_3$-$C_{30}$ heteroaryl group, and any combination thereof;

$Ar_2$ is selected from the group consisting of a substituted or unsubstituted pyrrolylene group, a substituted or unsubstituted pyrazolylene group, a substituted or unsubstituted imidazolylene group, a substituted or unsubstituted imidazolinylene group, a substituted or unsubstituted imidazopyridinylene group, a substituted or unsubstituted imidazopyrimidinylene group, a substituted or unsubstituted pyridinylene group, a substituted or unsubstituted pyrazinylene group, a substituted or unsubstituted pyrimidinylene group, a substituted or unsubstituted indolylene group, a substituted or unsubstituted purinylene group, a substituted or unsubstituted quinolinylene group, a substituted or unsubstituted phthalazinylene group, a substituted or unsubstituted indolizinylene group, a substituted or unsubstituted naphthyridinylene group, a substituted or unsubstituted quinazolinylene group, a substituted or unsubstituted cinnolinylene group, a substituted or unsubstituted indazolylene group, a substituted or unsubstituted carbazolylene group, a substituted or unsubstituted phenazinylene group, a substituted or unsubstituted phenanthridinylene group, a substituted or unsubstituted pyranylene group, a substituted or unsubstituted chromenylene group, a substituted or unsubstituted benzofuranylene group, a substituted or unsubstituted thiophenylene group, a substituted or unsubstituted benzothiophenylene group, a substituted or unsubstituted isothiazolylene group, a substituted or unsubstituted benzoimidazolylene group, a substituted or unsubstituted isoxazolylene group, a group of Formula 5A, a group of Formula 5B, a group of Formula 5C, a group of Formula 5D, and any combination thereof:

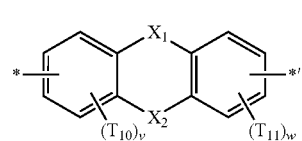

Formula 5A

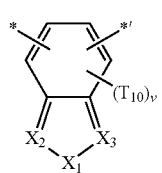

Formula 5B

-continued

Formula 5C

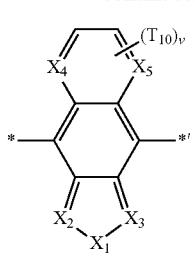

Formula 5D

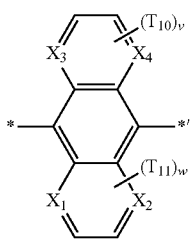

wherein $X_1$ to $X_5$ are each independently selected from the group consisting of

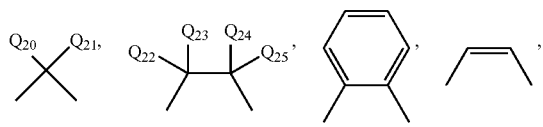

—O—, —S—, —N═, —N($Q_{26}$)—, —C($Q_{27}$)═, and —C($Q_{28}$)($Q_{29}$)—, and any combination thereof, wherein $Q_{20}$ to $Q_{29}$, $T_{10}$ and $T_{11}$ are each independently selected from the group consisting of a hydrogen atom, a substituted or unsubstituted $C_1$-$C_{30}$ alkyl group, a substituted or unsubstituted $C_1$-$C_{30}$ alkoxy group, a substituted or unsubstituted $C_6$-$C_{30}$ aryl group, a substituted or unsubstituted $C_5$-$C_{30}$ heteroaryl group, and any combination thereof, v and w are each independently an integer of from 1 to 3 and * and *' are each independently a connection point within the polymer;

a, b, and c are each independently a real number wherein $0 \le a \le 0.99$, $0 < b \le 0.99$, and $0 < c \le 0.99$, and $a+b+c=1$;

$A_1$ is a linking group -$(L_2)_d$-, and $L_2$ is selected from the group consisting of —O—, a substituted or unsubstituted $C_2$-$C_{30}$ alkylene group, a substituted or unsubstituted $C_2$-$C_{30}$ alkenylene group, a substituted or unsubstituted $C_6$-$C_{30}$ arylene group, a substituted or unsubstituted $C_3$-$C_{30}$ heteroarylene group, and any combination thereof, wherein the $L_2$s of -$(L_2)_d$- are the same or different, and d is an integer of from 1 to 60;

∼ is an adjacent, attached polymer chain; and

* is a connection point within the polymer, wherein, in Formula 5A, at least one of $X_1$ and $X_2$ is selected from —O—, —S—, —N═, and —N($Q_{26}$)—;

in Formula 5B, at least one of $X_1$ to $X_3$ is selected from —O—, —S—, —N═, and —N($Q_{26}$)—;

in Formula 5C at least one of $X_1$ to $X_5$ is selected from —O—, —S—, —N═, and —N($Q_{26}$)—; and in Formula 5D, at least one of $X_1$ to $X_4$ is selected from —O—, —S—, —N═, and —N($Q_{26}$)—.

17. The organic light emitting device of claim 14, wherein the first layer is a hole transport layer.

18. The organic light emitting device of claim 14, further comprising an emission layer formed on a surface of the first layer.

19. A method of preparing an organic light emitting device, the method comprising:
forming a first electrode on a surface of a substrate;
forming a first layer including a cross-linked material of a cross-linkable polymer according to claim 1 by providing a first layer-forming composition including the cross-linkable polymer on a surface of the first electrode opposite the substrate, and heat-treating the cross-linkable polymer under conditions suitable for cross-linking the cross-linkable polymer to cross-link the cross-linkable polymer; and
forming a second electrode on a surface of the first layer opposite the first electrode.

* * * * *